United States Patent [19]

Davis

[11] Patent Number: 5,341,088

[45] Date of Patent: Aug. 23, 1994

[54] SYSTEM FOR RATING ELECTRIC POWER TRANSMISSION LINES AND EQUIPMENT

[76] Inventor: Murray W. Davis, 19790 Eastwood, Harper Woods, Mich. 48225

[21] Appl. No.: 912,813

[22] Filed: Jul. 13, 1992

Related U.S. Application Data

[62] Division of Ser. No. 741,964, Aug. 5, 1991, Pat. No. 5,140,257.

[51] Int. Cl.$^5$ .......................................... G01R 21/02
[52] U.S. Cl. ................................. 324/106; 324/105; 324/142
[58] Field of Search ............... 324/106, 105, 107, 95, 324/142

[56] References Cited

U.S. PATENT DOCUMENTS

| | | | |
|---|---|---|---|
| 679,769 | 8/1901 | Meyer et al. | 324/106 |
| 820,978 | 5/1906 | Laird | 324/106 |
| 4,728,887 | 3/1988 | Davis | 324/127 |
| 4,806,855 | 2/1989 | Davis | 324/127 |

FOREIGN PATENT DOCUMENTS

| | | | |
|---|---|---|---|
| 135736 | 11/1900 | Fed. Rep. of Germany | 324/106 |
| 434642 | 12/1911 | France | 324/106 |
| 556255 | 9/1922 | France | 324/106 |
| 21174 | 9/1907 | United Kingdom | 324/106 |

OTHER PUBLICATIONS

System IV, Real Time, Thermal Rating System-Sensor/Transmitter Unit and PLC/UHF Transmission of Data With and Without Ground Based Weather Station, Feb. 20, 1984, Murray W. Davis.
IEEE Transactions on Power Apparatus and Systems, vol. PAS-99, No. 6 Nov./Dec.1980. A New Thermal Rating Approach. The Real Time Thermal Rating System for Strategic Overhead Conductor Transmission Lines, Part IV, Daily Comparisons of Real-Time and Conventional Thermal Ratings and Establishment of Typical Annual Weather Models, Murray W. Davis.
Presentation to the IEEE Conference, Jul. 20, 1982, Presented by Mr. J. H. A. Pearson.
The Georgia Power Dynamic Thermal Line Rating System, W. Z. Black, Jul. 18-23, 1982.
Dynamic Thermal LIne Ratings, PART II, 1982 SM 378-8 (no month).
Real-Time Ampacity Model for Overhead Lines 1983, WM 145-0 (no month).
IEEE Tansactions on Power Apparatus and Systems, vol. PAS-96, No. 3, May/Jun. 1977, Murray W. Davis.
IEEE Transactions on Power Apparatus and Systems, vol. PAS-97, No. 2, Mar./Apr. 1978, Murray W. Davis.
IEEE Transactions on Power Apparatus and Systemn, vol. PAS-99, No. 5, Nov./Dec. 1980, Murray W. Davis.

*Primary Examiner*—Ernest F. Karlsen
*Attorney, Agent, or Firm*—Howard & Howard

[57] ABSTRACT

A system for determining the current carrying capability of one or more overhead power transmission lines monitors one or more spans of each line on real-time basis and identifies the span having the lowest current carrying capacity which in turn establishes the maximum capacity of the entire line. The thermal state of each monitored line span is determined by measuring the conductor temperature, line current, solar radiation, ambient temperature, and in some cases wind speed and wind direction. These parameters are montiored by a sensor-transmitter unit that may be removably clamped on the line conductor which may range in size from one to several inches in diameter, and includes a radio transmitter for transmitting sensed data to a receiving substation. The data from the sensor-transmitter is multiplexed and transmitted by a telecommunications link to a computer which automatically determines line capacity using the real-time data and also calculates the time required for the "critical span" having the lowest current capacity to reach its maximum safe temperature based on any of a number of step changes in load demands. Each sensor-transmitter may include sensors for monitoring the current level, conductor temperature, solar radiation impinging on the conductor, ambient-temperature, wind direction and velocity and conductor sag.

4 Claims, 15 Drawing Sheets

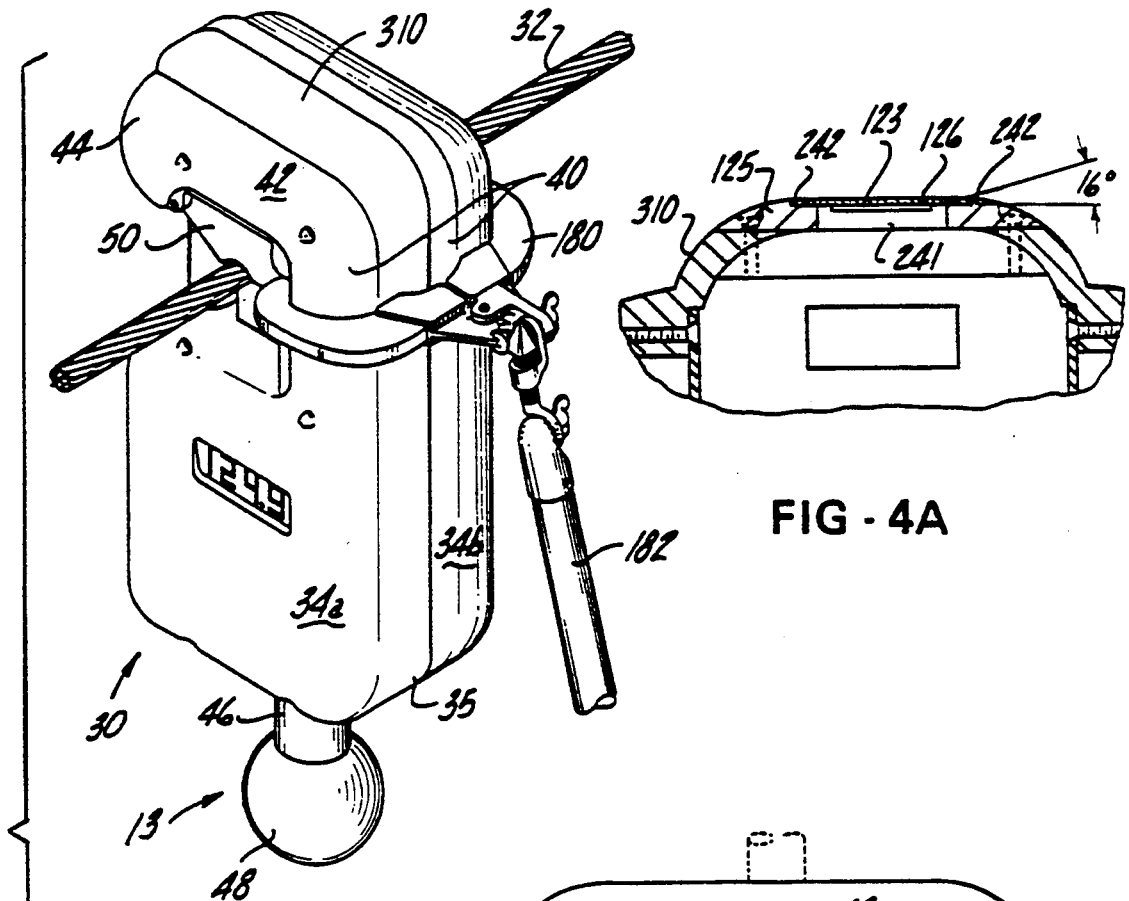
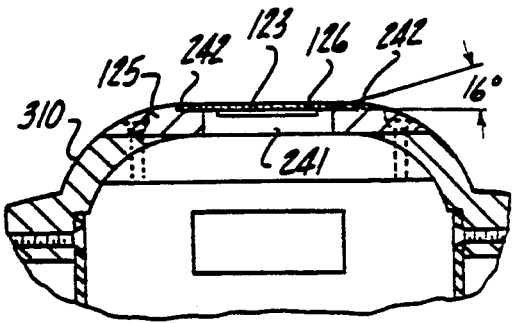
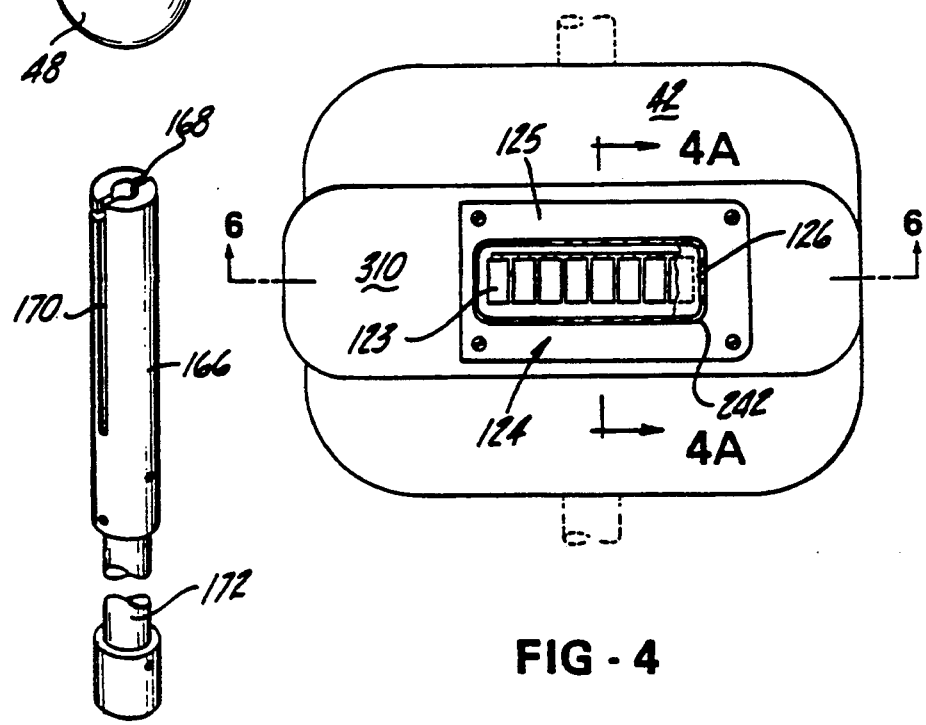
FIG - 1
FIG - 4A
FIG - 4

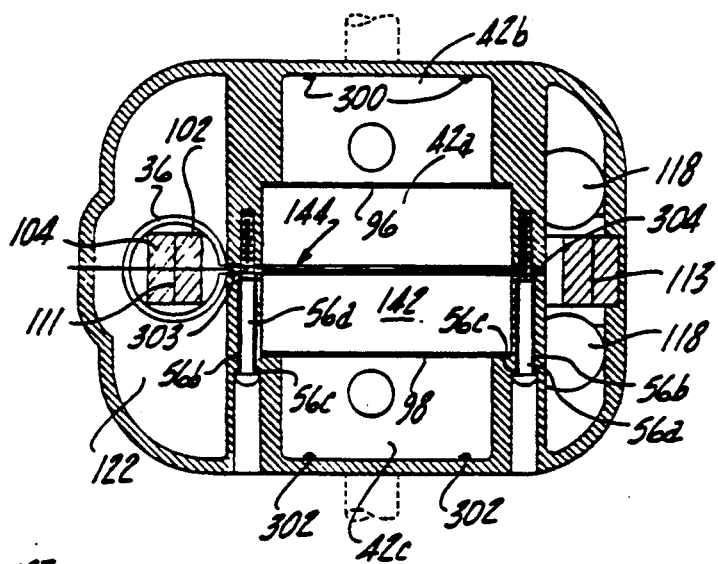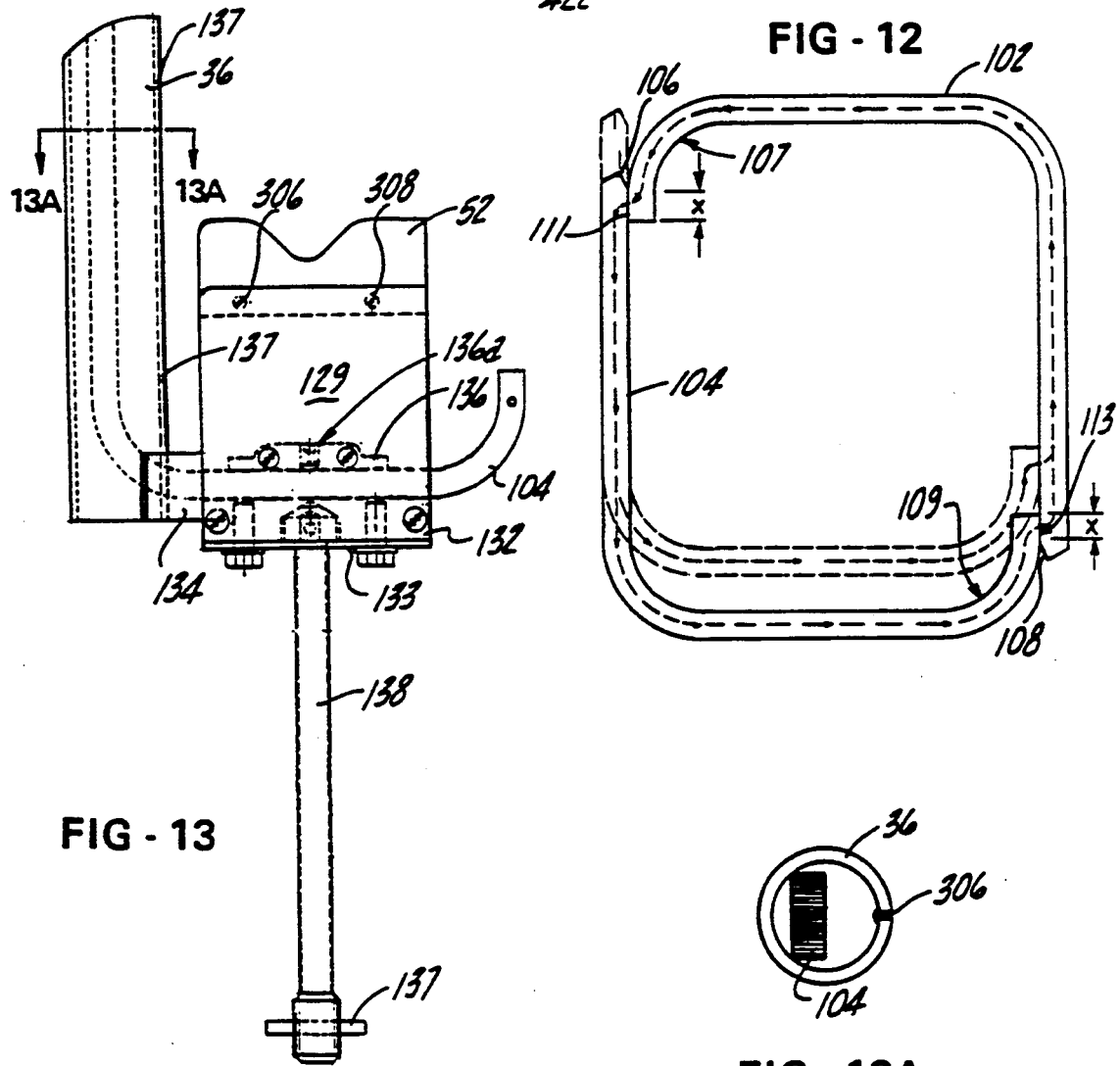

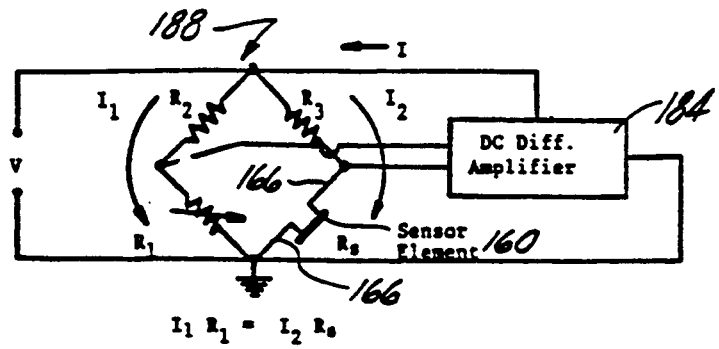
FIG - 26
FIG - 27
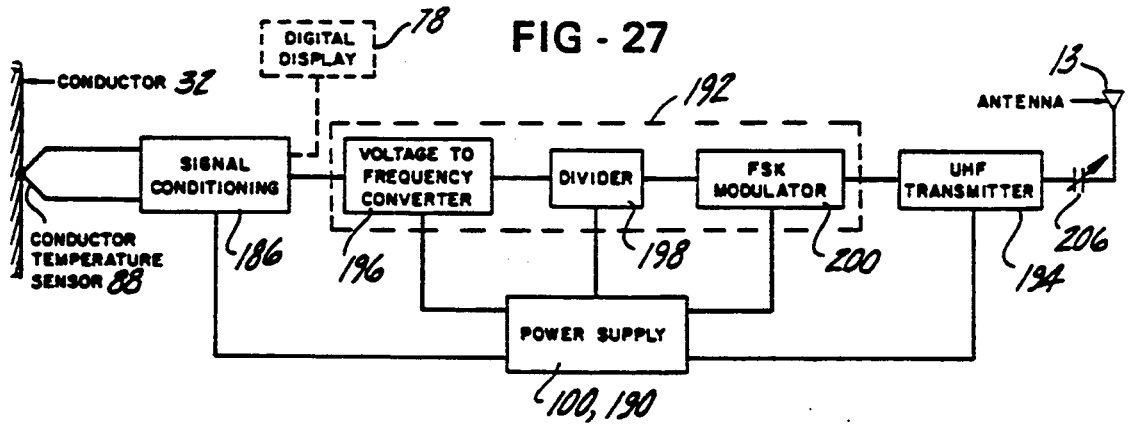
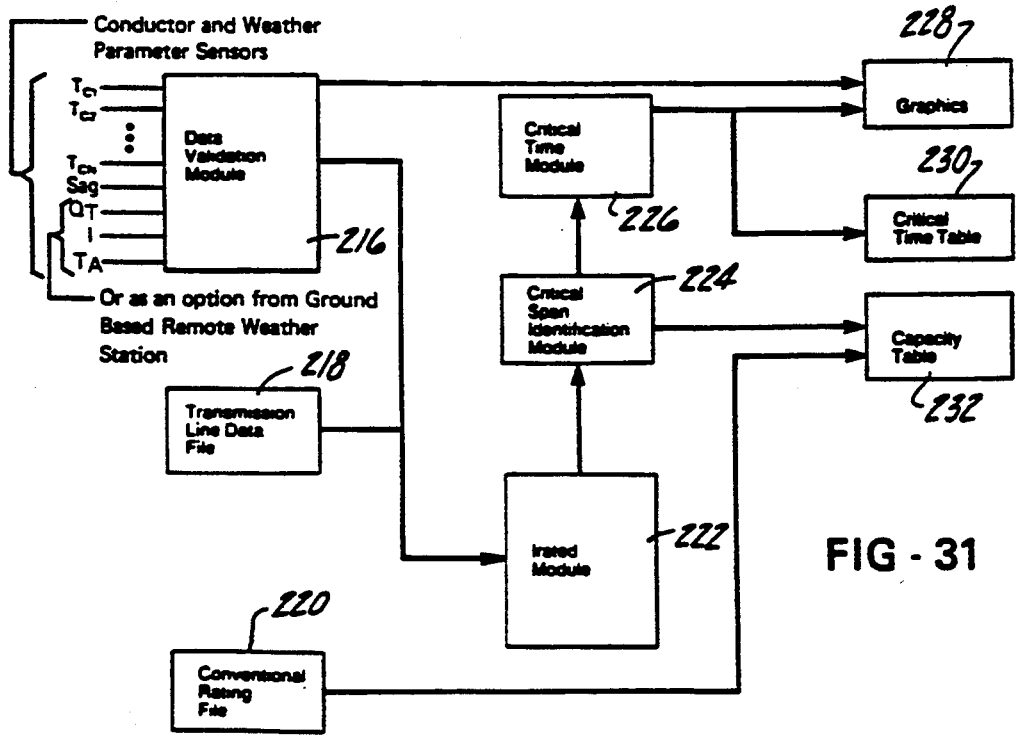
FIG - 31

SYSTEM FOR RATING ELECTRIC POWER TRANSMISSION LINES AND EQUIPMENT

This is a divisional of copending application Ser. No. 07/741,964 filed on Aug. 5, 1991, now U.S. Pat. No. 5,140,257.

TECHNICAL FIELD

The present invention broadly relates to electric power transmission systems, especially those employing overhead electric power lines, and deals more particularly with a system for rating the current carrying capacity of the transmission lines and equipment on a real-time basis by taking into consideration the thermal effects of line current, wind velocity and wind direction, solar radiation, and ambient temperature on the line conductor temperature.

BACKGROUND ART

As the load on an electric power system grows, the line current increases and energy losses become greater. The load is measured in terms of the product of volts and current, or VA. Therefore, in the past it has been standard practice to increase the voltage level in order to meet growing demands, thereby lowering the current and minimizing the energy losses. This approach may be undesireable, however, because of the potential adverse environmental effects of the higher voltage levels, including high electric fields, radio and television interference, audible noise and induced voltage. If higher voltage levels are not employed to satisfy increased demands, the remaining options available to utilities are: increasing the current of the transmission line, employing load management methods and/or encouraging conservation. Of these options the only one which has no adverse effect on the consumer or the environment is to increase the current carrying capability of the transmission line, even though energy losses may increase slightly.

In order to design and effectively utilize overhead electrical power transmission lines, it is necessary to determine their actual thermal capacity which in turn determines the maximum amount of electrical current that the lines may safely carry. In the past, design ratings for the lines have been derived from theoretical calculations based on pessimistic weather conditions and selected values of conductor temperature. The safe values of conductor temperature are based on line clearance requirements and loss of tensile strength criteria. Weather conditions substantially affect the current carrying capacity of an overhead electrical power line. Theoretical calculations are normally based on assumptions of low wind speeds perpendicular to the conductor, high ambient temperatures and maximum solar radiation, consequently the calculation for arriving at the design rating is based on the assumption that the weather will have a minimum cooling effect on the conductor While maximizing the amount of heat absorbed by the conductor. This ensures that the line temperature will be the highest attainable when the line is carrying the rated load in order to prevent the sag of the line from exceeding a preselected safe clearance above the ground, or in order to prevent the conductor from losing more than the acceptable loss of tensile strength.

It has been found that the conservative theoretical approach described above sometimes results in line temperatures greater than the calculated value. Numerous reasons exist for this disparity; for example, in the event the wind speed is lower than the assumed value, or if the wind is blowing parallel to the conductor, and both the ambient temperature and solar radiation are greater than the assumed values, then the line temperature, and consequently the line sag will be greater than expected.

In order to obtain more accurate design ratings, some utility companies in the past have established weather stations at various locations in the general vicinity of the transmission lines in order to monitor the weather and thus obtain more reliable climatological data which is used to improve the calculations for arriving at the design ratings. This approach to the problem is less than completely satisfactory for two reasons. First, the weather information recorded at a single location is not necessarily representative of the weather along an entire transmission line. Secondly, since weather is variable in both time and location, it is impossible to accurately calculate how the conductor temperature will respond to these variable conditions.

It would therefore be desireable to measure the actual temperature of the transmission line on a real-time basis, since this would allow rating the line as function of the prevailing weather conditions rather than based on assumed pessimistic weather conditions or weather forecasts. Measuring the actual conductor temperature of the line provides two advantages. First, line capacities greater than the design rating are presently available for approximately 90% of the time during the year. Secondly, utilities can now predict when a transmission line cannot safely carry the design rated load. A system for directly monitoring the line temperature and weather parameters and for determining the maximum capacity of each transmission line would afford an immediate, low cost, minimum risk solution to a capacity deficiency problem which may be particularly acute in areas where there is uncertainty in the load growth rates, public resistance to acquiring rights-of-way for overhead lines and inadequate capital funding.

U.S. Pat. Nos. 4,268,818 and 4,420,752 disclose devices for monitoring, on a real-time basis, the conductor temperature, ambient temperature and line current of an overhead power line. The devices shown in these patents required that the conductor temperature sensor be installed at some distance away from the device so as not affect the measured conductor temperature. These devices were adaptable only to a relatively small range of conductor sizes, without changing the clamp used to attached the device to the conductor line. Since hundreds of different conductor sizes are currently in service, these devices have limited application in those cases where the transmission line designer desires to move the device from location to location and install them on different conductor sizes.

As discussed in these prior patents, the load carrying capability of a power line may be restricted by its thermal rating; the thermal rating is the maximum current the line is capable of carrying and is normally based on the maximum allowable or safe conductor temperature and assumed, worst-case weather conditions. The starting point in establishing this rating is to select a safe value of conductor temperature such that the line clearance requirements and loss of conductor tensile strength criteria are not exceeded.

In establishing the thermal rating, it is necessary to select a safe value of conductor temperature, which is normally based on clearance requirements, i.e., the distance from the power line to the nearest point on the earth or to an object under the power line. When a steady-state current is applied to a transmission line conductor during steady-state weather conditions, the line heats up due to the internal heat generated within the conductor or the $I^2 R$ losses. This causes the conductor temperature to increase above the ambient air temperature and the line begins to sag from its original unheated position to a lower position, since the length of the line changes. Assuming the line is fixed at each end to a tower or similar structure, the tension will also decrease, since the length of the line becomes longer when heated. The final value of the sag that a conductor reaches for a set of weather conditions and current is important since clearance requirements must not be exceeded in order to protect against objects on the ground coming in contact with high voltage lines. Additional factors affecting the final sag of the line include mechanical creep and elevated temperature creep.

The mechanical creep is a function of time and tension, whereas elevated temperature creep is a function of line tension, conductor temperature and time. Both of these factors also Increase the sag of a line. When the Initial stringing tension is known, the mechanical creep can be determined as a function of time only. Elevated temperature creep is a function of line tension, conductor temperature and time. Based on the above, if the conductor temperature is monitored, then the actual line sag or clearance can be determined on real-time basis.

Another factor affecting the choice of the maximum conductor temperature is the loss of conductor tensile strength as the conductor is heated. For any specific conductor size, type (i.e., ACSR, aluminum, copper, etc.) and stranding, the loss of strength is dependent on conductor temperature and time. The loss of tensile strength is accumulative, that is, the more the conductor is heated, the greater the loss of strength and the initial strength is never regained.

As is apparent from the foregoing, all of the factors which limit the current rating to a safe value are a function of conductor temperature. Thus, if the line conductor temperature and weather conditions are monitored, then the maximum real-time current will be substantially greater than the conservative design rating for a large portion of time during the year.

A primary object of the present invention is to overcome each of the deficiencies of the prior approach to establishing the thermal rating of power lines. This, and further objects of the invention will become clear or will be made apparent during the course of the following description of a preferred embodiment of the invention.

SUMMARY OF THE INVENTION

The present invention provides a system for rating the current carrying capacity of electrical power lines and associated equipment, and measures the temperature of the line, line loading, and related ambient conditions affecting the thermal rating, on a real-time basis. Rating the current carrying capacity is achieved by measuring the line current, conductor temperature, ambient temperature and solar radiation for each portion or span of the line. Having determined the thermal state of the conductor, the maximum current that each span may carry can be calculated.

The system includes four (4) major components: (1) A plurality of sensor-transmitter units, (2) a receiver, (3) a programmed computer, and (4) a transmission line data file. The sensor-transmitter units are clamped to spans of the power line and sense the temperature of the conductor, and optionally may also sense ambient temperature, solar radiation, line current, wind velocity and direction, and the sag for the associated span on a real-time basis. The sensed information is transmitted by the sensor-transmitter to a receiving station, and is thence multiplexed via a telecommunications link to a programmed computer at an operations center. The transmission line data file consists of physical, mechanical and electrical characteristics of the lines, and line orientations. Using the transmission line data file, the computer calculates the maximum current capacity for each monitored span. The span of the transmission line with the lowest computed current capacity is identified as the "critical span". This critical span is then selected and the resultant calculated current capacity of such span becomes the maximum transmission line capacity. Based on any of a plurality of possible load levels, the computer projects the length of time it will take the critical span of each monitored line to reach its maximum allowable temperature level.

Because of the low probability of low wind speeds at high ambient temperatures during maximum load levels, thermal ratings obtained by the system of the present invent ion are higher than those derived from conventional, prior art methods.

Each sensor-transmitter unit consists of a corona free housing, a conductor clamping device, a power supply, one or more parameter sensors, one or more signal conditioning circuits, a modulator, an RF transmitter and an RF antenna. The corona free housing protects the electronic components installed therein from severe environmental conditions and high electric and magnetic fields. The housing is at the same electrical potential as the power line, is free of corona and does not generate audible noise, or radio or television interference at high voltages. The unit may be easily clamped on a wide range of sizes of conductors using an a specially designed, electrically insulated hot stick while the line is energized. The unit is powered from the electrical energy derived from the power line itself.

The sensor-transmitter unit of the present invention eliminates the need for obtaining information from remote weather stations. The unit possesses greater radio transmission range, compared to prior art designs, is relatively small in size and is light weight. The system provides numerous other benefits and advantages. For example, use of the present system by electric utilities provides much high thermal line capabilities and has a significant impact on deferring the building of new system facilities. Because of the thermal time lag of the conductor line, short duration emergency ratings well in excess of steady state emergency ratings may be achieved because the actual conductor temperature, line loading and weather conditions are known.

The system may be extended to include other limiting elements of the power system such as terminal equipment, power transformers, etc., and thereby provides an increase in those ratings which ordinarily limit the line loading.

Since the the actual conductor temperature of the transmission line is known, system operations during normal and emergency conditions will be improved with reduced system risk.

In the past it has been common to estimate the conductor loss of strength and sag based on an assumed conductor temperature-time model. A question existed as to how accurate the model was compared to the actual operating temperature; the present system can be used to create more realistic thermal models which in turn result in an accurate determination of the sag and loss of conductor strength.

The present system may be employed to compute line resistance and energy losses more accurately.

It is often difficult to arrange shut downs of certain lines due to other lines being loaded over their emergency rating. Use of the present system will substantially reduce the need for these types of shut downs, thereby resulting in economic savings since power generation does not have to be rescheduled. The present system allows determination of the internal temperature gradient of the conductor line, and the effect the temperature gradient has on sag. Since the thermal state of the conductor is known, the present system may be used to predict the time an overload can remain on a line before reaching its safe limiting conductor temperature.

Risk curves which indicate the percent of time the real-time rating is above or below the conventional rating are available from the programs forming a part of the present system, and these curves provide the degree of risk that system operators take by exceeding any preset rating level.

The present system thus provides an indication of the risk for each load level on the transmission line, thereby allowing an operator to exercise better judgement in selecting different load levels for each line, depending upon the importance of each line segment in maintaining the integrity of the transmission network.

Finally, the present system may be employed to prevent ice formation on overhead power lines. Since the conductor temperature is measured by the sensor-transmitter unit, the current can be increased so as to maintain the conductor temperature greater than 32 degrees F.

These, and further features and advantages of the present invention will be made clear or will become apparent during the course of a detailed description of the system set out hereinbelow.

BRIEF DESCRIPTION OF THE DRAWINGS

In the drawings, which form an integal part of the specification and are to be read in conjunction therewith, and in which like reference numerals are employed to designate identical components in the various views:

FIG. 1 is an upper perspective view of the sensor-transmitter of the present invention, during installation thereof on an overhead power line and also depicts tools for lifting the sensor-transmitter unit onto the line and clamping the unit on the line;

FIG. 4 is a top plan view of one form of the sensor-transmitter unit employing a solar radiation sensor;

FIG. 4a is an enlarged sectional view taken along the line 4a—4a in FIG. 4;

FIG. 11 is a sectional view taken along the line 11—11 in FIGS. 2 and 10;

FIG. 12 is a side elevational view of the upper and lower portions of the transformer core shown in FIG. 10, removed from the sensor-transmitter unit;

FIG. 13 is a detailed, side elevational view of the jaw opening and closing mechanism of the sensor-transmitter unit shown in FIG. 10;

FIG. 13a is a sectional view taken along the line 13a—13a in FIG. 13;

FIG. 26 is a combined block and schematic diagram of a circuit employed in the sensor-transmitter unit for sensing wind velocity and direction;

FIG. 27 is a block diagram of the electrical circuit employed in the sensor-transmitter unit;

FIG. 31 is a flow chart for the software employed by the programed computer which forms part of the system of the present invention.

DETAILED DESCRIPTION OF THE INVENTION

Figure 2:
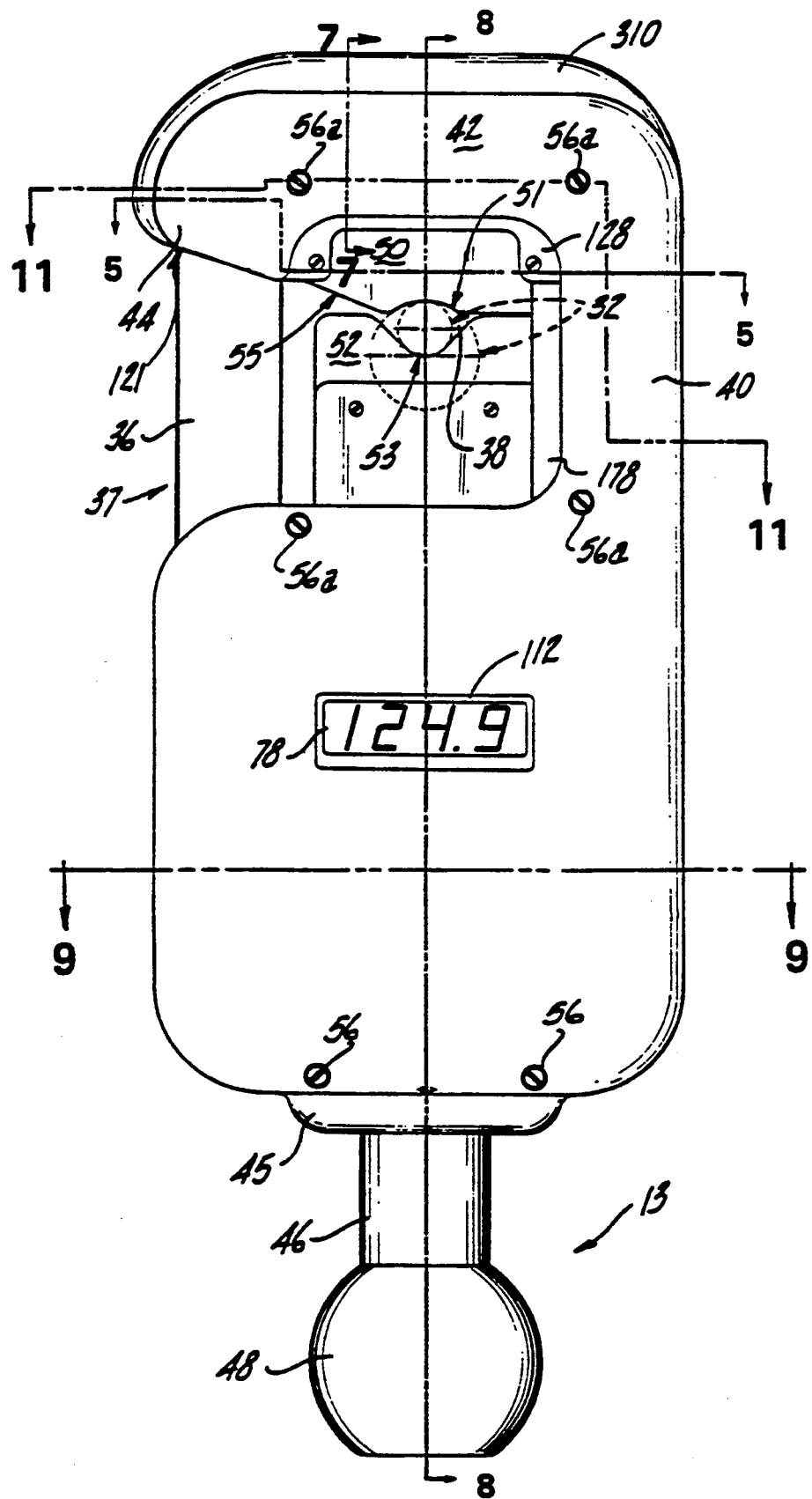
FIG. 2 is a side elevational view of the sensor-transmitter shown in FIG. 1, with the jaws in a closed, clamping position.

The present invention provides a system for rating the current carrying capacity of electrical power lines and associated equipment, which measures the temperature of the line, line current, and related ambient conditions affecting the thermal rating, on a real-time basis. Before turning to a description of the details of the system it is important to appreciate how the thermal state of a power line conductor can be defined by measuring only the ambient temperature, conductor temperature, solar radiation and line current.

Under steady state conditions, the current flow in an electrical conductor may be defined by the following equation, $$I^2R + Q_s = Q_c + Q_r, \text{ or} \qquad (1)$$

$$I = \left( \frac{Q_c + Q_r - Q_s}{R} \right)^{\frac{1}{2}}, \qquad (2)$$

where $Q_e$ is the convected heat, either free convection or forced convection, $Q_r$ is the thermal radiation, and $Q_s$ is the solar radiation absorbed by the conductor. Equation (1) represents a heat balance equation, that is, the internal heat generated within the conductor, or $I^2R$, plus the heat gained from the sun must be equal to the heat lost by thermal convection and thermal radiation. The current may be found from equation (2) if $Q_c$, $Q_r$, $Q_s$, and R, the resistance as e function of conductor temperature $t_c$, are known.

The heat transfer rate Q is defined by the equation $$Q_c = hA(t_c - t_a) \qquad (3)$$

where h is the surface coefficient of heat transfer, A is the surface area of the conductor per unit length, $t_c$ is the surface temperature of the conductor and $t_a$ is the ambient air temperature. If the surface conductor temperature and ambient air temperature are measured or monitored and the outside conductor diameter $D_o$ is given, then the convected heat $Q_c$ can be calculated once h is determined. It is apparent that the convected heat, either forced or free, could be obtained directly under steady state conditions from equation (1), if the other three heat quantities are known. If the current, conductor temperature, ambient temperature, and solar radiation are measured then the convected heat is the only remaining quantity in equation (1).

The current, an electrical quantity, does not change in magnitude as a function of position along the conductor line therefore it may measured at the termination of the line with no loss of accuracy. The other quantities must be measured on the line because they vary due to variable ambient conditions along the line. The first term in equation (1), that is, the internal heat $I^2R$, can be found by measuring the current and calculating the resistance from the measured conductor temperature. Therefore, the $I^2R$ losses at any point along the line can be computed directly from the measured current of the line and the conductor temperature at each point along the line.

The other two terms in equation (1) are the solar radiation absorbed by the conductor $Q_s$, and the thermal radiation $Q_r$. The amount of solar radiation absorbed by the conductor can easily be determined, given the solar absorption constant, conductor size and orientation, beamed radiation $Q_B$, diffuse radiation $Q_D$, and time. Although the quantities $Q_D$ and $Q_B$ can be measured, it is more convenient to measure the solar radiation on a horizontal surface and calculate the beamed and diffuse radiation components. If the conductor temperature $t_c$, and the ambient temperature $t_a$ are measured and the physical properties of the conductor, emissivity E, and the conductor diameter $D_o$ are given, then $Q_r$ can be calculated.

When the $I^2R$ losses at any point along the line, and $Q_s$ and $Q_r$ are calculated, $Q_c$ becomes the only unknown term in equation (1), or $$Q_c = I^2R + Q_s - Q_r, \qquad (4)$$

and h can be found from equation (3), $$h = \frac{Q_c}{D_o \pi (tc - ta)} \qquad (5)$$

Notice that the only measured quantities needed in arriving at the convected heat are the current, conductor temperature, ambient temperature and solar radiation.

Once the thermal state of the conductor or h has been defined, the maximum real-time current that any one segment of a transmission line can carry is easily determined by substituting the maximum allowable conductor temperature for the line segment, and the measured ambient temperature and solar radiation values into equation (2). The resistance R is evaluated at the maximum allowable conductor temperature. It could be said that the measured quantities $t_c$, $t_a$, I, and $Q_s$, have defined the "now" thermal state of the conductor, and equation (2) gives the maximum real-time current that could flow such that the maximum safe conductor temperature is not exceeded. This presumes that the thermal state does not change over a short time interval, and of course this is true because the conductor has an associated thermal time constant. This also infers that the conductor temperature and current must be monitored at small intervals of time. In general, the conductor temperature will be operating at a level well below that which would cause the line to exceed clearance end loss of strength requirements, because the conservative thermal rating or current for the line historically has been based on low wind speeds and high ambient temperatures. Therefore, the real-time current carrying capacity will be considerably higher than the design rating.

There have been a number of references hereinabove to the fact that the thermal state of the conductor is known at a point or at a line segment, since atmospheric conditions could vary substantially along the entire length of a transmission line. This is true because the sensor-transmitter measures the conductor temperature, ambient temperature, and solar radiation at a point on the conductor and, therefore, these conditions are representative of those existing on a segment of line or a span of the line. In order to extend the concept of the present invention to the entire line, it is necessary to install a sufficient number of sensor-transmitters, so that these conditions are known for each portion of the transmission line. Normally, not more than one sensor is needed for each span, since the line cannot change direction within the span.

Figure 3:
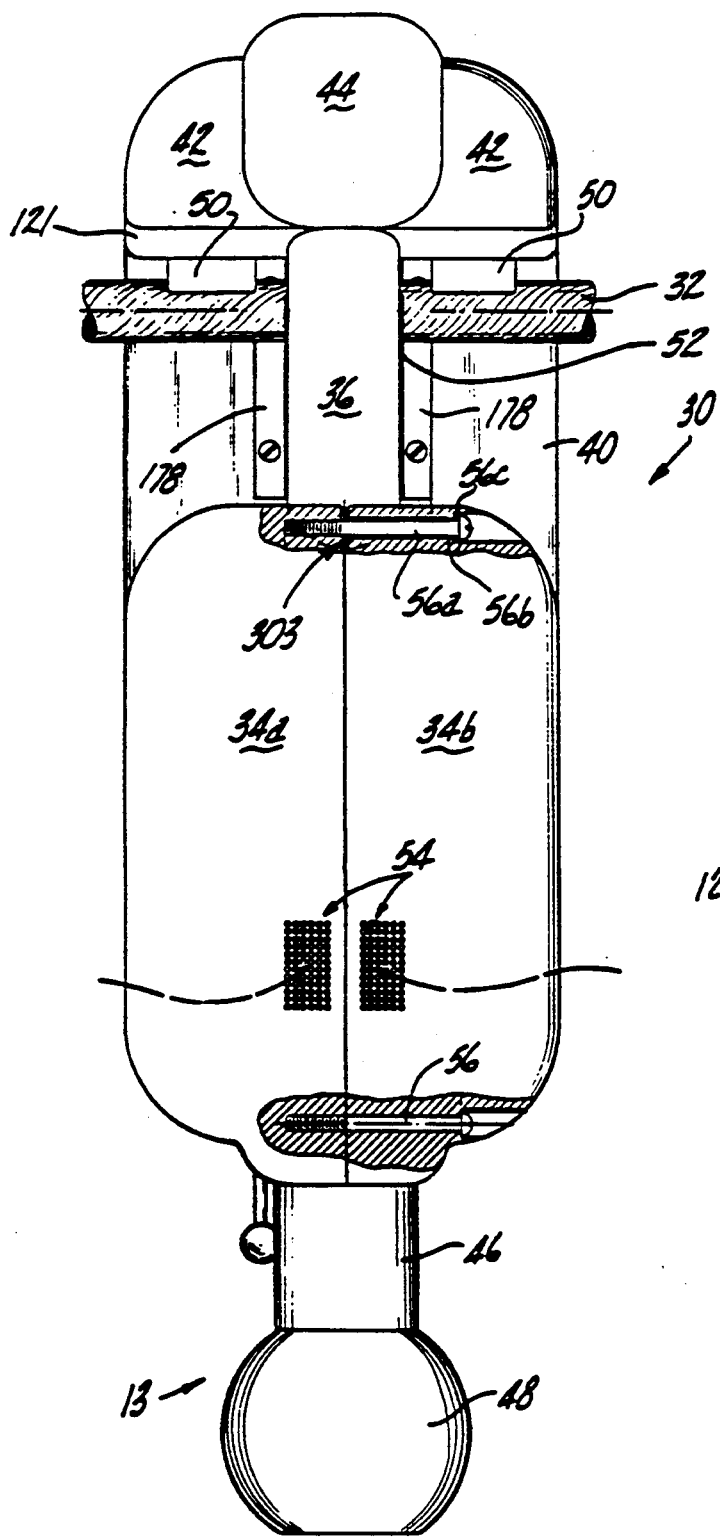
FIG. 3 is a front view of the sensor-transmitter unit, parts of the housing being broken away in section to reveal the means for interconnecting the two halves of the unit.
Figure 4B:
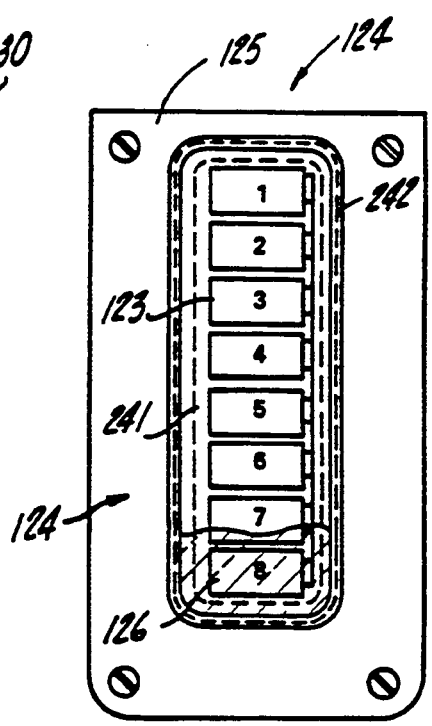
FIG. 4b is an enlarged top plan view of the solar radiation sensor shown in FIG. 4.
Figure 5:
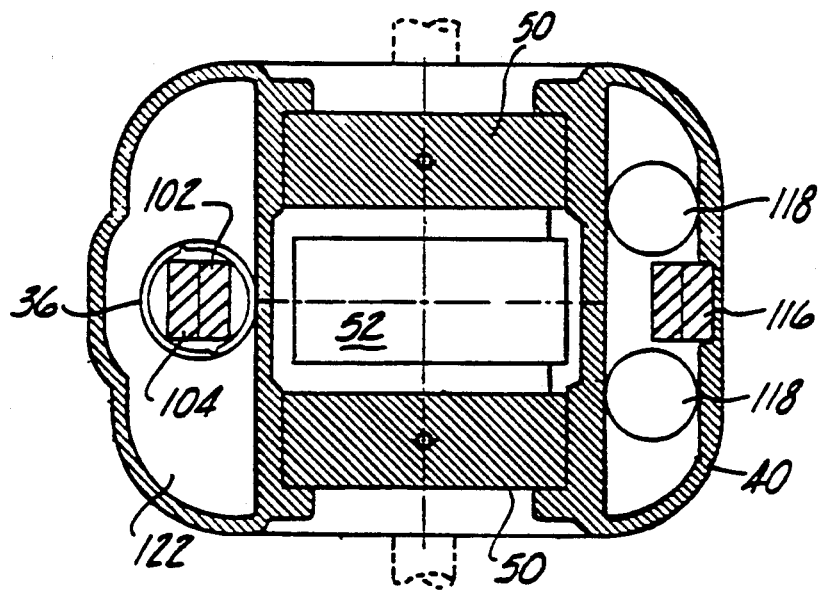
FIG. 5 is a sectional view taken along the line 5—5 in FIG. 2.
Figure 6A:
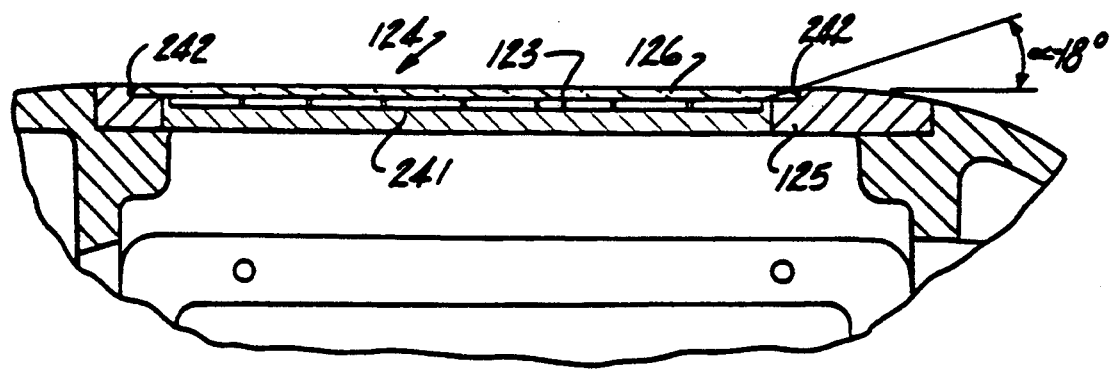
FIG. 6a is an enlarged, longitudinal sectional view of the solar radiation sensor shown in FIG. 4.

Referring now to FIGS. 1-3, the present invention involves a system for rating the thermal or current carrying capacity of overhead electric transmission lines, and employs a sensor-transmitter unit generally indicated at 30 for monitoring certain parameters used in calculating the thermal rating of the lines. The unit 30 includes a housing 34 adapted to be removably clamped to a current carrying conductor, reich as the overhead power line conductor 32. The housing 34 includes first and second halves 34a and 34b secured together by a plurality of machine screws 56. The four upper machine screws 56a are provided with insulative bushings and washers 56b, 56c in order to electrically isolate the upper portions of the housing halves 34a and 34b.

The housing 34 is generally "C-shaped" in geometry and comprises a substantially rectangular base 35, an upwardly extending rear column 40, and forward upper extension 42 which includes a downwardly turned nose 44. The upper extension 42 and nose 44 are spaced above the base 35 to define and opening or passageway 37 through which the conductor 32 may be passed during installation or removal of the unit 30 from the conductor 32. The passageway 37, which facilitates installation of the unit 30 on the conductor 32, is selectively opened and closed by a later discussed opening and closing mechanism.

The exterior surface of the housing 34 is formed in a manner to eliminate sources of corona when the unit 30 is installed on high voltage transmission lines. The housing 34 may be formed by casting a zinc and aluminum alloy material, by forming sheet aluminum using a deep draw die or from an epoxy-like substance including an aluminum binder or from aluminum using a sand casting process. Preferably, the housing 34 is formed from an aluminum alloy and is vapor blasted or burnished to ensure a smooth, corona free surface and is anodized to reduce oxidation.

Stationarily mounted on the housing 34, and extending into the passageway 37 are a pair of upper stationary jaws 50 each provided with an arcuately shaped or radiused jaw surface 51 having a curvature essentially identical to that of the largest diameter conductor 32 on which unit 30 is intended to be mounted. A lower, reciprocable jaw 52 is mounted within the housing 34 by a later discussed mechanism, and includes an arcute or radiused jaw surface 53 having a curvature substantially equal to that of the smallest diameter line 32 in the range which the unit may be installed upon.

A radio antenna generally indicated at 13 defined by a cylindrical antenna tube 46 formed of aluminum or the like is secured to and extends downwardly from an antenna base 45 on the bottom of the housing 34. A metal sphere 48 is secured around the lower end of the tube 46 and functions to prevent the antenna from producing corona. The tube includes an opening 76 (FIG. 8) therethrough into which a tool 166 may be inserted for opening and closing the jaw 52 relative to jaws 50. The tool 166 is secured on the end of a hot stick 172 (insulated rod shown in FIG. 1) and includes a horizontal groove 168 on the end thereof as well as a longitudinal extending slot 170.

As best seen in FIG. 3 the upper jaws 50 are spaced apart from each other and engage the conductor 32 on opposite sides of the point at which the lower jaw 52 engages the conductor 32.

Attention is also now directed to FIGS. 5 through 9 wherein the interior features of the housing 34 are depicted in more detail. The interiors of the housing halves 34a, 34b, respectively, include a plurality of compartments for protectively enclosing various components from both the environment and the electric and magnetic fields respectively produced by the voltage on the conductor 32 and the current flowing through conductor 32. A pair of substantially rectangular compartments 58 and 60 are respectively defined in the rectangular base portion of housing halves 34a and 34b. The compartments 58, 60 are sealed off from the environment and electric as well as magnetic fields by a pair of corresponding cover plates 62, 64 which may optionally include louvers 68 permitting air to enter the corresponding compartments. Cover plates 62, 64 are spaced apart to define central opening 65 in housing 34 within which there is contained a later discussed jaw opening and closing mechanism (FIGS. 13, 14, 16 and 17). Later discussed electronic components and/or circuit boards are mounted on the inside faces of the cover plates 62, 64, while the exterior faces of plates 62, 64 provide a surface for mounting guide tracks 66 which aid in confining the travel of the jaw opening and closing mechanism in a vertical direction. It may thus be appreciated that ready access may be gained to the compartments 58, 60 for servicing the electronic components simply by removing the cover plates 62 and 64. The cavity 116 internal of the column 40 provides a compartment for two electrolytic power supply capacitors and a portion of a later discussed upper magnetic core portion 102.

It should be noted that the cover plates 62, and 64 are preferably formed from ferrous material which shields the electronic components from magnetic fields around the conductor 32. Additionally, the position of the compartments 58 and 60 spaces the electronic components as far away from the conductor 32 as possible to reduce the influence of magnetic fields. The cover plates 62, 64 are secured within recesses In the housing halves 34a, 34b and further function to provide the housing 34 with rigidity which tends to resist the torque applied to housing 34 when the laws 50, 52 are closed by the tool 166.

Figure 7:
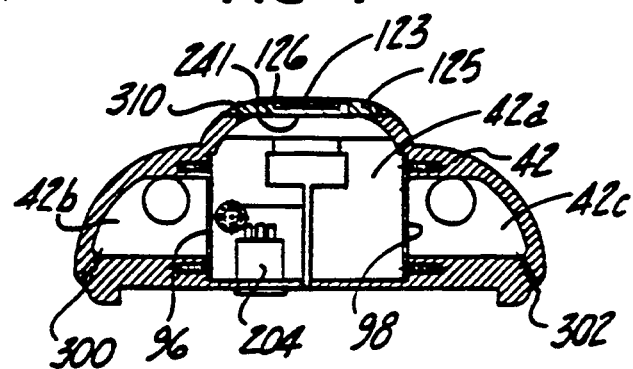
FIG. 7 is a sectional view taken along the line 7—7 in FIG. 6.
Figure 6:
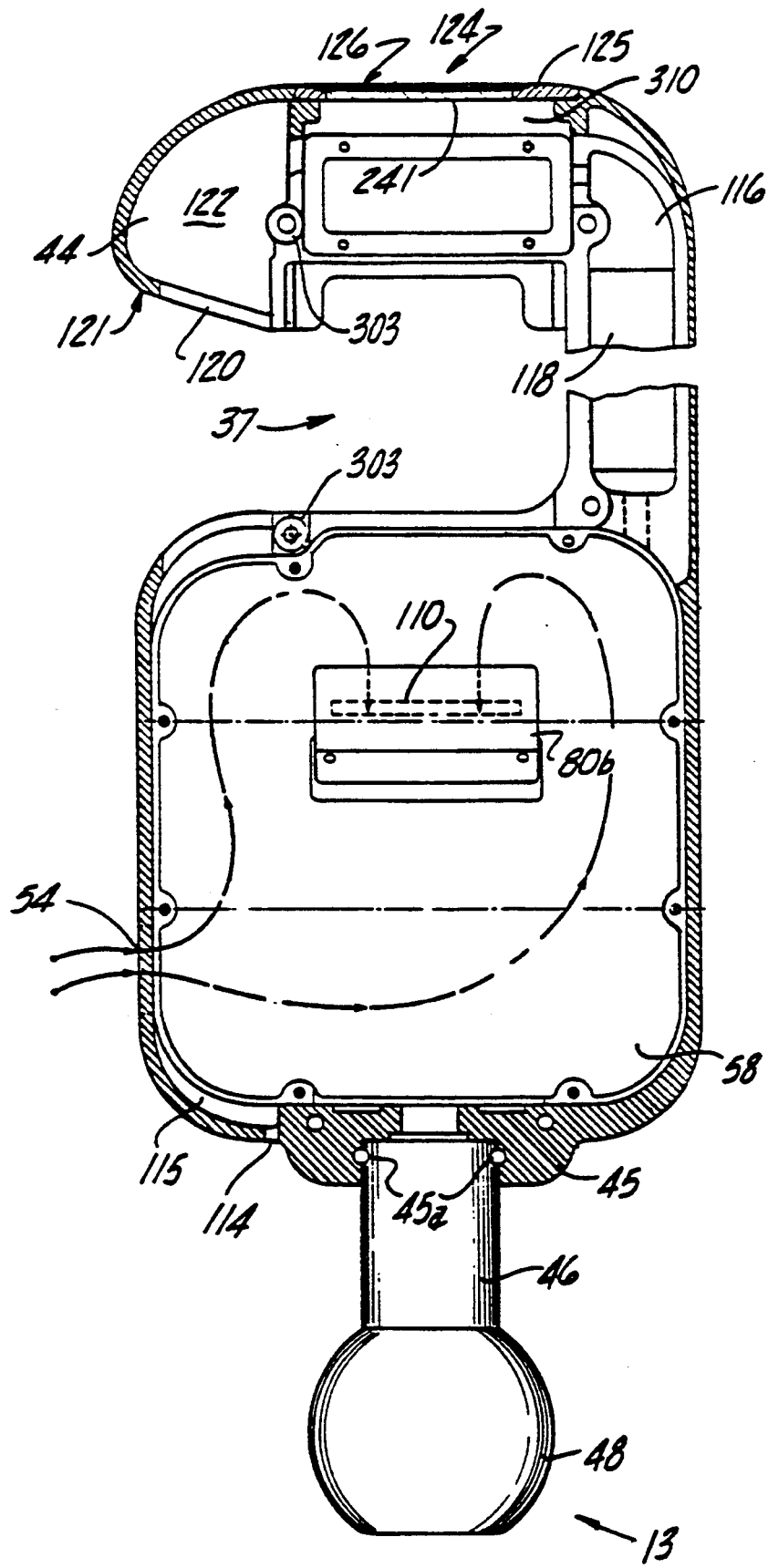
FIG. 6 is a view of the interior of one half of the housing of the sensor-transmitter unit, the internal parts having been removed to better reveal the internal compartments thereof.

As best seen in FIGS. 7 and 11, the upper extension 42 of the housing includes a central power supply compartment 42a formed by mating cavities in the housing halves 34a, 34b, and a pair of temperature sensor compartments 42b and 42c. The laterally spaced apart temperature sensor compartments 42b and 42c are closed off from the power supply compartment 42a by a pair of corresponding cover plates 96, 98.

Figure 8:
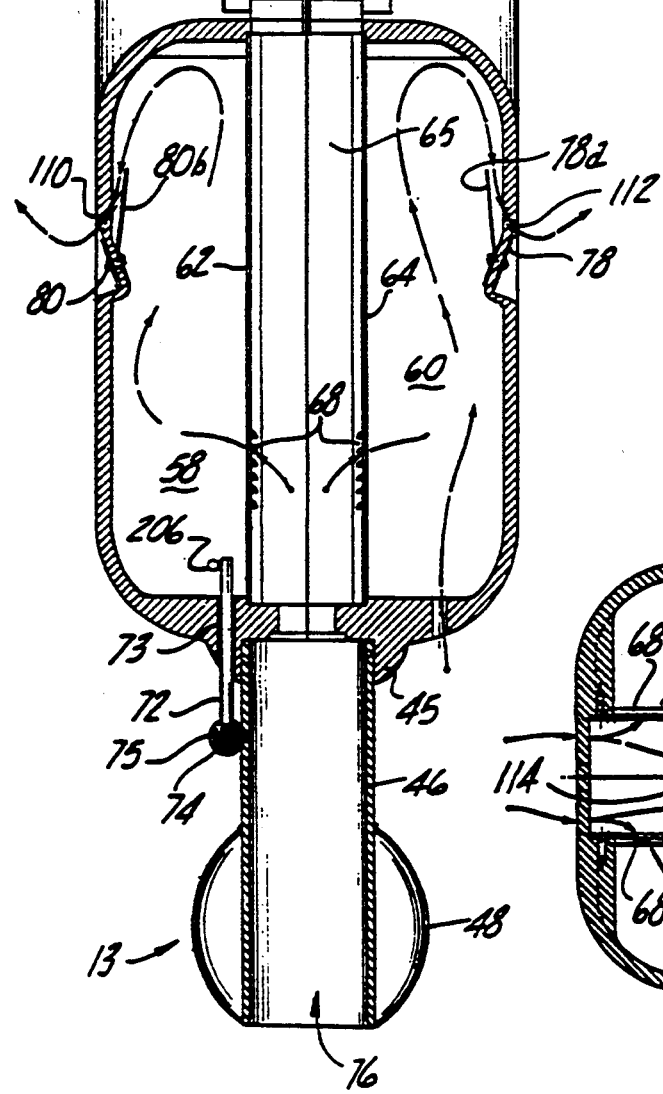
FIG. 8 is a sectional taken along the line 8—8 in FIG. 2, several of the electrical circuits and the jaw opening and closing mechanism having been removed for clarity.
Figures 14, 15:
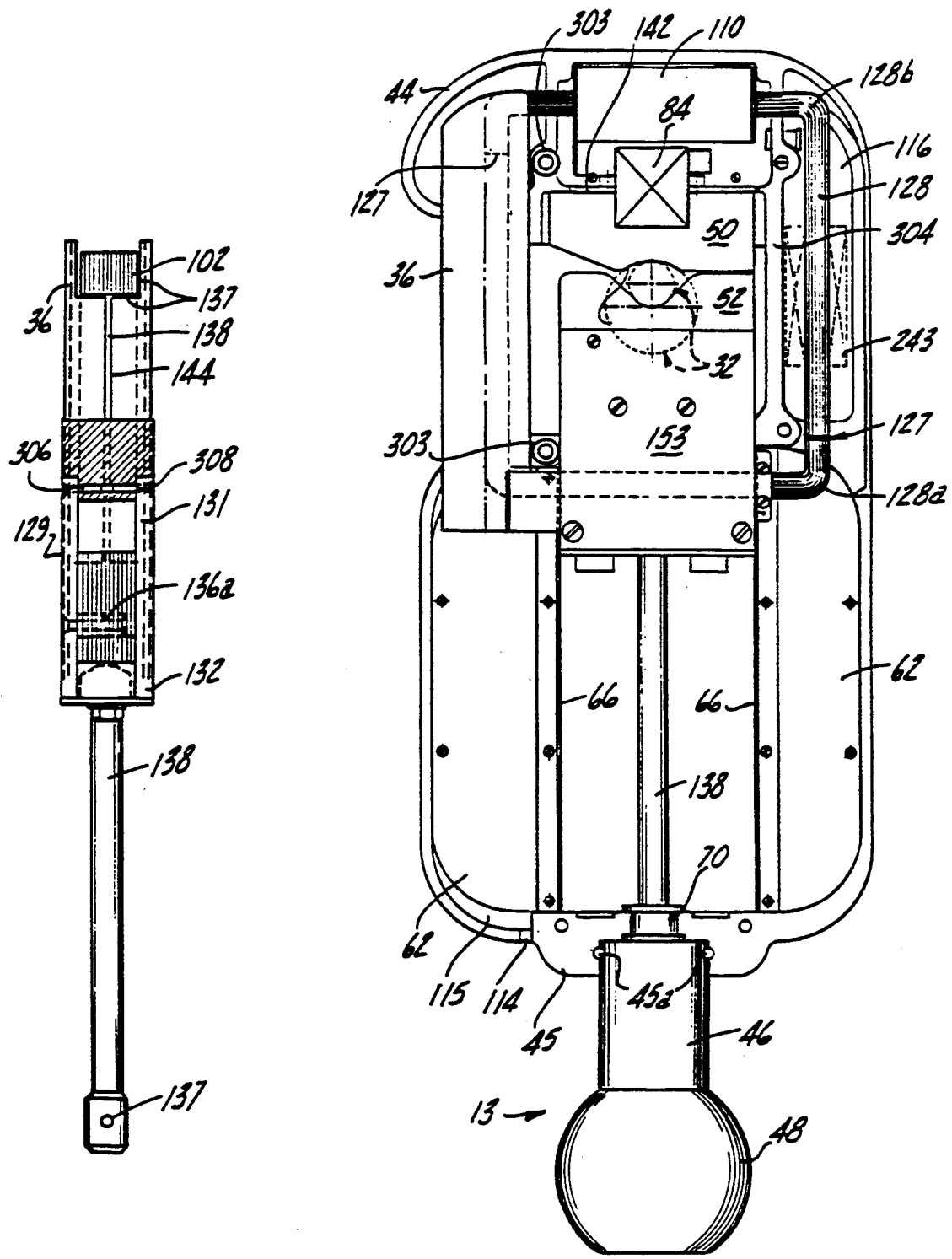
FIG. 14 is a front elevational view of the mechanism shown in FIG. 13.
FIG. 15 is a side elevational view of the sensor-transmitter unit with one half of the housing removed, and showing an alternate form of the transformer core.
Figure 25:
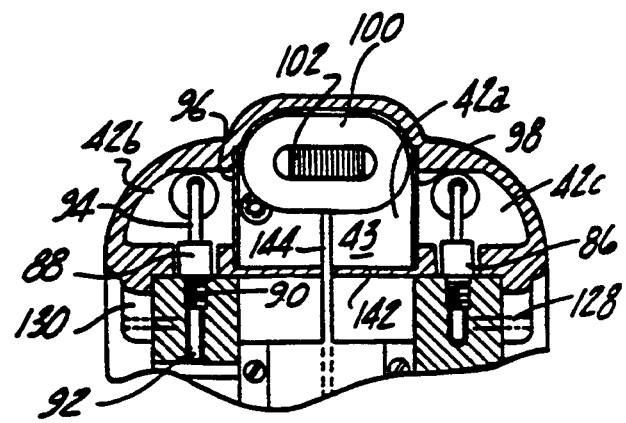
FIG. 25 is a fragmentary, sectional view of the upper portion of an alternate form of the sensor-transmitter unit which does not employ an inclinometer for measuring sag.

The power supply for the unit 30 comprises a later discussed transformer core 102, and a transformer coil 100 which is mounted in the power supply compartment 42a which is positioned as far away from the conductor 32 as possible so that the heat generated from the power supply does not affect the temperature of the conductor 32. Thermal conduction from the core 102 and coil 100 to the conductor 32 is further reduced by air space 43 (FIG. 25) beneath the coil 100 and floor 142 at the bottom of the compartment 42a. Cover plates 96 and 98 function to seal the temperature sensor compartments 42b, 42c and strengthen the housing around those compartments. A portion of the floor 142 may be removed as shown in FIGS. 8 and 15 in order to mount an inclinometer 84 for measuring the sag of the conductor 32.

Figure 23:
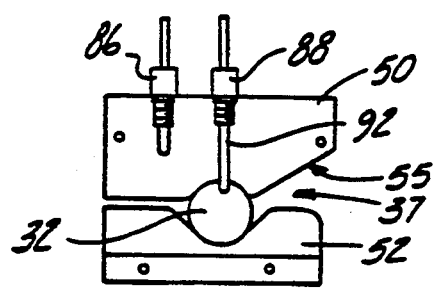
FIG. 23 is a side elevational view of the jaws showing the relative placement of the temperature sensors.
Figure 24:
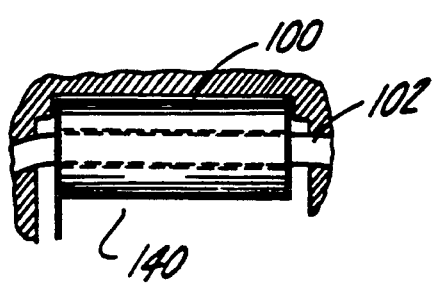
FIG. 24 is a fragmentary, longitudinal sectional view taken through power supply transformer coil.

Located in compartment 42b is a temperature sensor 88 in the form of a transducer for sensing the temperature of the conductor 32. A second temperature sensor 86 is mounted in compartment 42c for sensing the ambient temperature or another conductor temperature. The number of conductor temperature and ambient temperature sensors that may be installed in the upper and lower jaws 50, 52 will depend upon the overall system reliability that is desired. In the event that only one conductor temperature sensor is used, the ambient temperature sensor 86 is typically installed in the right upper clamp (FIG. 8). The ambient temperature sensor 86 is located a distance away from the conductor 32 so that temperature measured is the same as the outside ambient temperature. For conductors larger than one inch in diameter, for example, the ambient sensor 86 is not mounted directly over the conductor 32, but rather is mounted in the right jaw 50 near the column 40, as shown in FIG. 23. The ambient temperature 86 may also be installed in the lower jaw 52 if desired. In any event, all three of the jaws 50, 52, are normally shaded so that direct sunlight does not heat the jaws. Mounting the ambient and conductor temperature probes in the thermally insulating material of the jaws avoids heating of the probes by direct sunlight on the probes and direct sunlight on the unit 30. Consequently, direct sunlight does not affect the measured ambient or conductor temperatures.

Figure 22:
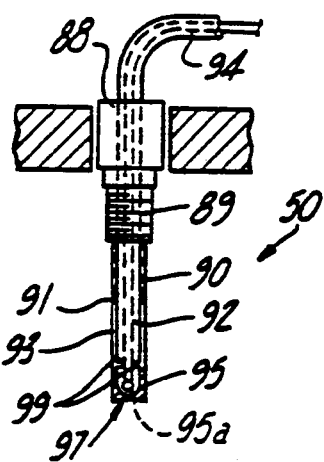
FIG. 22 is a detailed, sectional view of the mounting arrangement for the conductor temperature sensor.

As best seen in FIGS. 22 and 23, the conductor temperature sensor 88 is mounted on the floor of the temperature sensor compartment 42b and includes an elongate probe 92 which extends downwardly through an opening in the floor and through the jaws 50 where the conductor 32 is clamped. The probe 92 is reciprocally mounted for travel into and away from the opening between the jaws 50, 52 by means of a spring 90 which is sleeved over the probe 92. The spring 90 is held between the teflon sleeve 93 and a threaded fitting 89. The mass of the probe 92 should preferably be made small with respect to the mass of the conductor 32 or conductor strands. To increase the contact surface and provide a more uniform contact over the entire end of the magnetically shielding probe 92, while making the mass as small as possible, a small aluminum shoe 95 is heat shrunk over the outer end of the probe 92. The high interference fit created by heat shrinking the aluminum shoe 95 eliminates a temperature drop which would otherwise occur if a thin air film were present between the shoe 95 and the probe 92. The shoe 95 is provided with a partially cylindrical bottom surface 97 which approximates the curvature of the conductor 32 and is intended to conformally engage the conductor 32. Shoe 95 may be plated on the outside with silver or cadmium for use on copper and aluminum conductors 32, so that galvanic corrosion, caused when different metals are in contact with each other, does not occur.

To further minimize temperature sensing error produced when heat is conducted from the conductor 32 up through the probe 92, a thermal constriction is provided immediately above the top of the shoe 95; the thermal constriction is formed by a pair of slots 99 in the outer surface of the probe 92. The slots 99 define a relatively small amount of probe material therebetween which in effect restricts the amount of heat that can flow upwardly through the probe 92. In order to compensate for any reduction in strength of the probe 92 as result of the slots 99, a tube 93 of material having a low thermal conductivity, such as teflon is formed around the probe 92. A spring clamp 91 retains the spring 90 on the probe 92. The spring 90 biases the probe 92 downwardly into contact with the conductor 32. Heat loss from the shoe 95 to the ambient environment is minimized by concealing a substantial portion of the shoe 95 and the probe 92 within the thermally insulating jaw 50 when the probe 92 is depressed by the conductor 32.

The leads of the temperature sensing transducer 95a are preferably magnetically shielded with stainless steel tubing 94 or the like. The conductor temperature sensor 88 may comprise a standard type thermocouple available from Omega Engineering Inc. The temperature sensor 88 is preferably modified, however, to reduce the error in measuring the temperature of the conductor strands. The ambient temperature sensor 86 may consist of a standard thermocouple or intergrated circuit transducer. As previously discussed, in order to increase the contact surface and provide uniform contact over the entire end of the probe 92, while making the mass as small as possible, a small aluminum shoe is heat shrunk over the tip of the probe 92. A high interference fit is created by heat shrinking the aluminum shoe to the thermocouple probe 92; this eliminates a drop in the temperature that would otherwise exist if a thin air film were present between the aluminum shoe and the probe 92. Typically, the aluminum shoe on the probe 92 will contact two or more strands of the conductor 32. Additionally, thermal constriction slots must be added to the probe to reduce heat from being conducted from the conductor 32 up through the probe and a teflon sleeve is installed around the probe to compensate for loss of strength in the probe due to the constriction slots added therein.

In lieu of the thermocouple, the temperature sensor 88 may comprise an intergrated circuit temperature transducer which is commercially available from Analog Devices and is identified by the manufacturer's No. AD 590.

The bottom of the housing 35 is provided with a water well 115 formed between the housing halves 34a, 34b in order to collect any water which may gain access to the interior 65 of the housing 35, between the two halves thereof. A drain hole 114 in the bottom of the housing 35 communicates with the well 115 in order to drain away the water. Four holes 67 are provided in the bottom of housing half 34a (FIG. 9) In order to provide ready access to zero and span adjustments for the ambient and conductor temperature signal conditioning circuits; these same holes assist tn draining condensation which accumulates within the housing half 34a and provide ventilation paths from the bottom of the compartment 58 to the top of the housing and out through horizontal ventilation slot 110. A drain hole 67a is also provided to drain condensation from the inside of housing half 34b and provide air circulation from the bottom of compartment 60, and out through slot 112. A pair of drain holes 300, 302 are provided in the floors of the temperature sensor compartments 42b, 42c in order to drain condensation therefrom (FIG. 11).

A pair of diverter plates 78a, 80b are mounted on the interior walls defining the compartments 58, 60 and function to divert ventilation air outwardly through the ventilation slots 110, 112 (FIG. 8).

The nose 44 of the housing 35 includes a wide, flat sloping surface 121 on the bottom thereof to assist in guiding the conductor 32 through and into the opening 37. A cylindrical opening 120 in the sloping surface 121 is provided to allow entry therein of a later discussed core cover sleeve 36. As best seen in FIG. 2, with the jaws 50, 52 closed, the sleeve 36 and nose 44 enclose the overlapped extremities of the core portions 102, 104 of FIG. 10. The cover sleeve 36 functions to protect the lower core portion 104 from the surrounding environment and provides a smooth conducting surface around the core portion 104 so that it will not become a source of corona in the high electric fields of the high voltage power line 32. As seen in FIG. 13a, the lower core portion 104 occupies a space on the left side of the center line of the cover sleeve 36. This arrangement allows the upper core portion 102 to occupy the space adjacent to the lower core portion 104 on the right side of the cover sleeve center line. As best seen in FIG. 14 the cover sleeve 36 includes notches 137 at the top thereof dimensioned to assure that an overlap of approximately 0.5 inches in maintained between the upper and lower core portions 102, 104, respectively.

Figure 17:
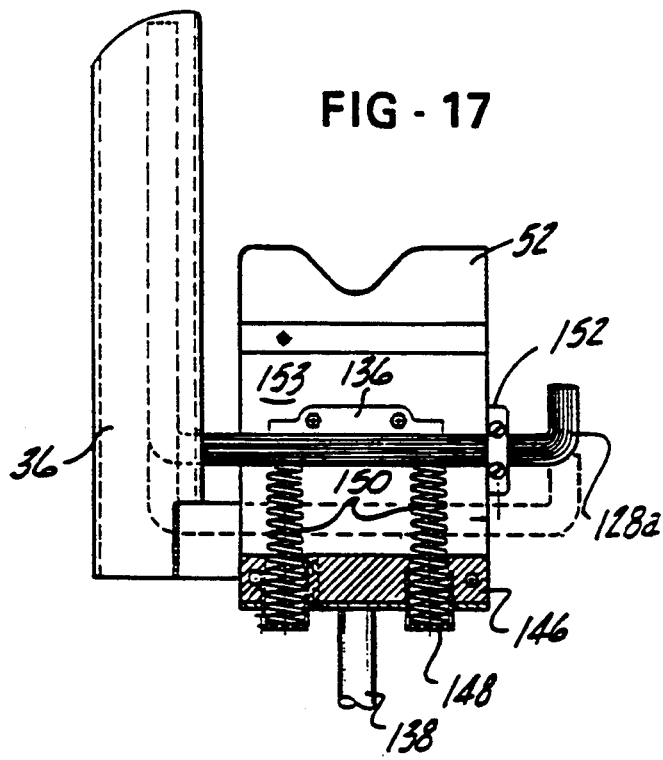
FIG. 17 is a sectional view taken along line 17—17 in FIG. 16.
Figure 19:
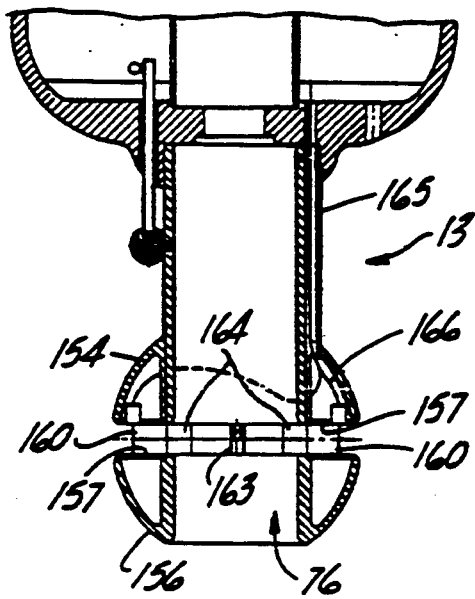
FIG. 19 is a sectional view taken along the line 19—19 in FIG. 18.

As seen in FIGS. 8, 11, 14 and 25, an isolation slot 144 is provided between the upper portion of the two halves 34a, 34b of the housing 34, which extends up through the inside of sleeve 36 to the inside of the column 40 and through the floor 42 of the power supply compartment 42a. Thus, the isolation slot 144 effectively circumscribes the conductor 32. Slot 144 electrically isolates the upper portions of the housing halves 34a, 34b from each other and therefore prevents the housing from acting as a low impedance turn of wire around 102, 104, thus preventing current from circulating around the housing and core and shorting the power supply transformer coil 100. This slot 144 may be formed by removing an appropriate amount of material from the opposite faces of upper portions of the housing housing halves 34a, 34b and installing a suitable insulating washer 303 (FIGS. 10 and 11) therebetween at the front of the housing and an insulating gasket 304 at the rear thereof. The slot in the cover sleeve 36 may be filled with a suitable insulating material 306 (FIG. 13a). Note in FIG. 14 there is also provided an isolation slot 144 between the back clamping plate 153 and core retainer 136, and above the lower core portion 104. Also, as shown in FIG. 17, an isolation slot 144 is provided between the back clamping plate 153 and the core retainer 136.

It should be noted that the geometry of the housing 34 and the weight distribution of the components of the unit 30 are arranged such that the vertical axis of the unit 30 (and thus the longitudinal axis of the antenna 13) remains vertical when the unit is installed on the conductor 32. Also, the center of gravity of the unit 30 lies below the conductor 32, thereby providing damping action to the torsional motion of the conductor 32 during high wind conditions and mitigates conductor galloping.

Bundle conductors, consisting of two or more conductors per phase, are sometimes used on high or extra high voltage transmission lines. The lateral distance between the center line of the conductor and the outside surface of the installed unit 30 is only approximately 5 inches. Because of this compact design, the unit 30 may be installed near the bundle spacer on one of the conductors of a twin conductor bundle, or on one of the lower conductors of a four conductor bundle arrangement, and adequate clearance is maintained between the unit 30 and any adjacent conductors.

Attention is also now directed to FIGS. 13, 13a and 14 which depict the lower jaw 52 as the well as the details of the opening and closing mechanism for the jaw 52. The jaw or clamping arrangement of the present invention is designed to prevent the heat sink effect that most metallic conductor clamps have on an overhead transmission line conductor and to assure that the unit 30 remains tight on the conductor 32 even though the differential thermal expansion of the housing 34 is much greater than that of the steel lead screw 138 which firmly holds the conductor 32 between jaws 50, 52.

The jaws 50, 52 are preferably constructed of a thermally insulating material that will operate satisfactorily at 400 degrees F. (240° C.), When unit 30 is installed on the conductor 32, the upper jaws 50 support the weight of the unit 30. The recessed jaw surface 51 in the jaws 50 holds the unit 30 in place and prevents the unit from rotating while the tool 166 is being used to tighten the unit on or remove the unit from the conductor 32. The unit 30 is precluded from rotating due to the fact that the upper jaws 50 are spaced apart and also because of the recessed conductor engaging surfaces of the upper jaws 50. The unit 30 is clamped on the conductor 32 by turning the lead screw 138 using the tool 166 which is inserted into the antenna tube 46. The lower end of the lead screw 138 is provided with a suitably configured key in the form of a transverse pin 137 which is mateably received within the horizontal groove 168 of tool 166. The groove 168 provides a means of turning the pin 137 and lead screw 138, and remains engaged with the pin 137 while the lead screw is being turned clockwise consequently a constant upward force need not be applied to the tool 166. As will become later apparent, the unit 30 is clamped onto the conductor 32, the conductor temperature probe is attached to the conductor 32, and the unit's power supply is turned on in a single step when the lead screw 138 tightens the jaws 50, 52 onto the conductor 32.

Figure 10:
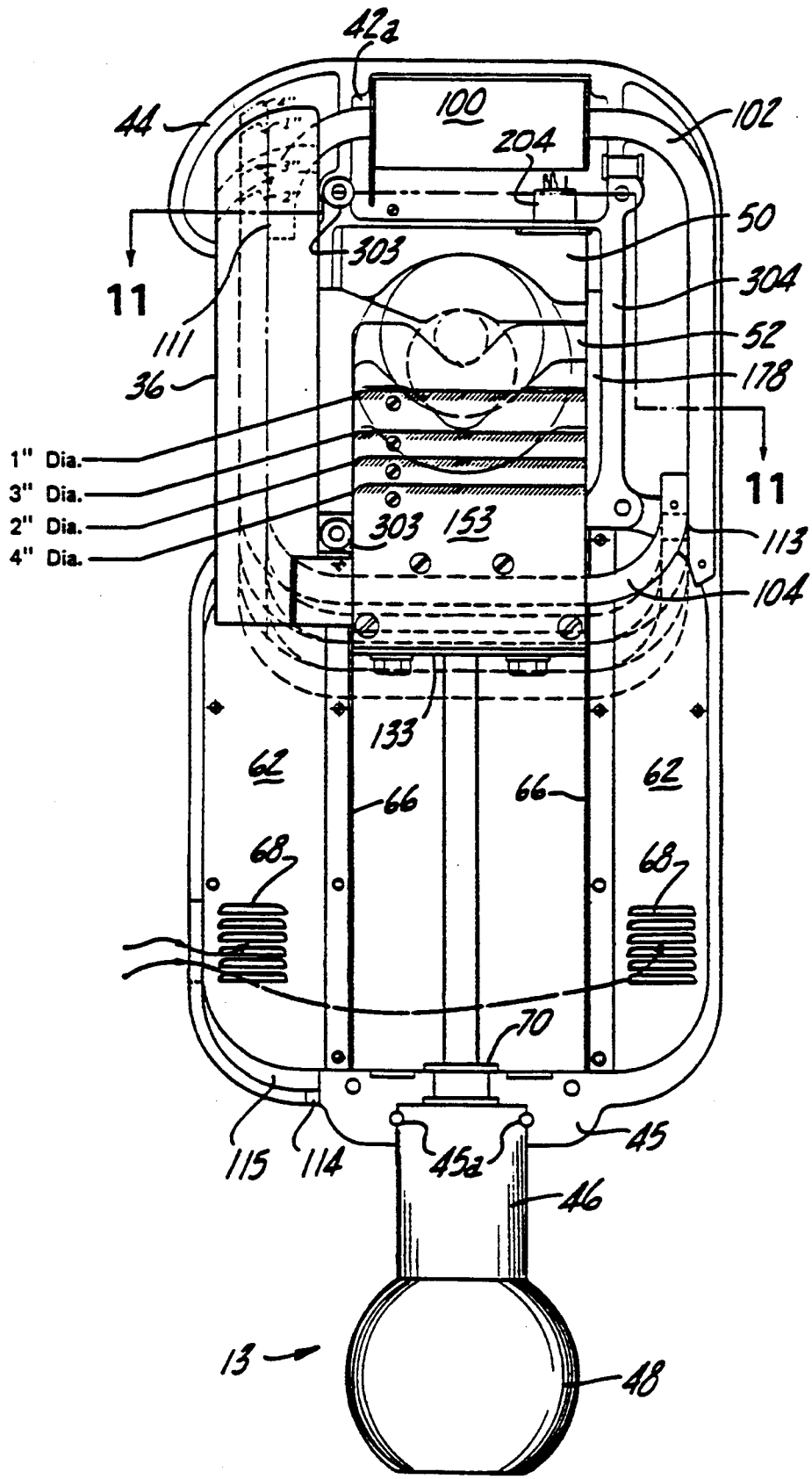
FIG. 10 is a view similar to FIG. 6, but showing the various internal components, with the right side of the housing removed and also depicting one form of the power transformer core.

The unit 30 is clamped on the conductor 32 by turning the lead screw 138 until the lower jaw 52 is secured to the conductor 32. In order to tighten the jaws securely, a torque of between 25 and 40 pounds for 1 to 2 inch diameter conductor lines is required. Because the conductor 32 is held at the top by two spaced apart jaws 50 and at the bottom with lower jaw 52 which is located centrally between the upper jaws 50, the conductor 32 is deflected slightly into a concave downward attitude. The conductor 32 does not take on a permanant set from the jaws 50, 52, but rather acts like a spring placed between the two upper jaws 50. This spring like action compensates for the difference in thermal expansion between the steel lead screw 138 and that portion of housing 34 to which the lead screw 138 is secured by means of a lead nut 70 (FIG. 10). Since the upper and lower jaws 50, 52 create a small moment on a section of the conductor 32, the unit 30 cannot slide or swing back and forth along the axis of the conductor 32.

The clamping arrangement of the present invention also avoids the phenomena known as conductor birdcaging because the temperature of the strands of the conductor 32 under the jaws 50, 52 is the same as the temperature outside the jaws. Bird-caging of the outside surface strands of a conductor, or the spreading out of the strands in a radial direction away from the inner strands of the conductor, Is a result of the strands under a metallic conductor clamp being at a lower temperature than those adjacent to the clamp and exposed to the ambient environment. In any event, this phenomena is avoided by staggering the placement of the jaws 50, 52 on the conductor 32, by providing as much air space as possible around the conductor 32, by minimizing the area of the jaw in direct contact with the conductor 32 and by using jaw material or an appropriate insulation thickness with low thermal conductivity. Spacing of the jaws 50, 52 relative to each other creates two radial air spaces on each side of the lower jaw 52. Additionally, the surface area of the conductor 32 directly below the upper jaws 50 and the above the lower jaw 52 is completely open to the ambient environment. Because the temperature of the conductor 32 under the jaws 50 is essentially the same as the undisturbed line temperature, an accurate measurement of the conductor temperature is achieved.

Each upper jaw 50 is mounted between an outer drip rail 128, 130 and a back plate 178 (FIG. 8). The drip rails 128, 130 function to prevent water from entering the interfacing area between the top of the jaws 50 and the underside of the floor of the temperature transducer compartments 42b, 42c. The back plate 178 functions to restrict movement of the jaws inwardly when lower jaw 52 is tightened against the conductor 32. The upper jaws 50 are secured to the housing 34 by machine screws or the like extending through the drip rails 128, 130. The back plate 178 is preferably formed of an insulating material such as nylon and provides a number of functions in the present invention. First, the back plate 178 assists in guiding the jaw opening and closing mechanism (FIGS. 13 and 14) and prevents the conductor 32 from being nicked when the unit 30 is installed on the conductor 32. It should be noted here that it is preferable to "slam" the unit 30 onto the conductor 32 during installation in order to prevent arcing therebetween. Additionally, the backing plate 178 prevents water from entering the column 40 and into the air gap between the core portions 102, 104. Finally, the insulative back plate 178 prevents thermal conduction from the conductor 32 to the housing 35 when the unit 35 is clamped onto larger conductors (See FIG. 10).

The jaw opening and closing mechanism best seen in FIGS. 13 and 14 is controlled by the hot stick operated tool 166 in order to clamp the unit 30 onto an energized conductor 32, to close the magnetic circuit of the power supply transformer which in turn powers the electronic circuits of the unit 30 and to attach the conductor temperature sensors on the surface of the conductor 32.

The jaw opening and closing mechanism includes a clamping block 132 secured to the upper end of the lead screw 138 and a retainer plate 133 secured to the mounting block 132 by means of machine screws. The lower jaw 52 is secured to the clamping block 132 by means of a pair of clamping plates 129, 131. The lower portion 104 of a j-shaped core portion has an intermediate section extending between the clamping plates 129, 131 and is secured to the clamping block 132 by means of a core retainer 136 and set screw 136a. The core cover sleeve 36 is secured to the clamping block 132 by means of a connecter plate 134 which is connected as by welding to the sleeve 36.

Figure 9:
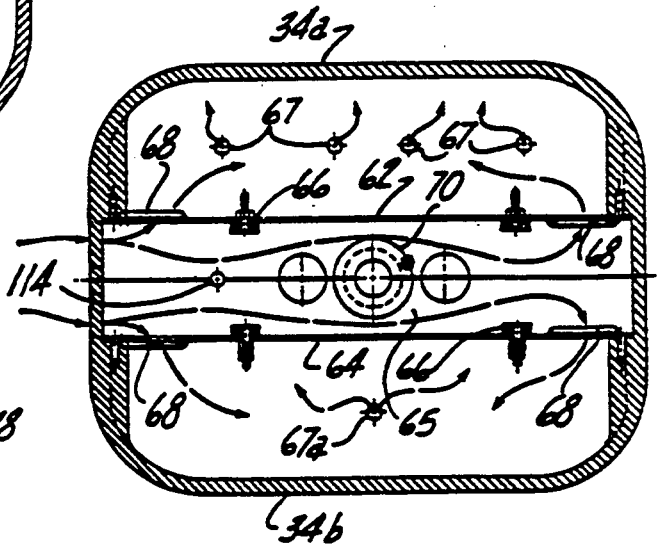
FIG. 9 is a sectional view taken along the 9—9 in FIG. 2, the jaw opening and closing mechanism having been removed for clarity.

The jaw opening and closing mechanism shown in FIGS. 13 and 14 is received within the open space indicated at 65 in FIG. 9 between the cover plates 62, 64 and is confined for vertical reciprocal movement by means of the guide tracks 66 shown in FIG. 10. Note that an open air space is provided below the jaw 52 and between the two clamping plates 129, 131; this space provides a high thermal resistivity path from the conductor 32 to the ambient air, and thus the heat thermally conducted away from the conductor 32 in the lower jaw area is negligible. This high thermal resistivity path is due to several reasons. First, the lower jaw 52 consists of a thermal insulating material of low thermal conductivity. Secondly, there is air space provided below the jaw 52. Finally, the back plate 178 is formed of a thermally insulating material. There is also an air space provided between the lower jaw 52 and the core cover sleeve 36. Thus, the conductor 32 is either in direct contact with the ambient air, or is in contact with a very small area of the jaws 50, 52 which in turn, have very high thermal resistivity paths to the housing 34. This design ensures that the surface temperature of the conductor 32 is not affected by the presence of the unit 30 mounted on the conductor 32.

The clamp block 132 Is offset slightly relative to the center line of the conductor 32 in order to achieve proper weight distribution which maintains the unit vertical when clamped on the conductor 32.

The lower jaw 52 is held place between the clamping plates 129, 131 using a pair of screws 306, 308. One screw 306 enters through the front clamping plate 129 and into the jaw 52 while the other screw 308 extends through the back clamping plate 131 and into the jaw 52. If the screws 306, 308 extended through the front clamping plate 129, through the jaw 52 and into the back clamping plate 131, a circulating current would flow around the core defined by a path consisting of the clamping block 132, the clamping plates 129, 131 and the screws 306, 308.

As best seen in FIG. 10, the upper jaws 50 are sized to fit the largest conductor within a particular range of diameters, while the lower jaws 52 are sized to fit the the smallest conductor in the range. For example, in a unit adapted to clamp onto 1 to 2 inch conductors the upper jaw would possess a recessed surface 51 having a 1 inch radius and the lower jaws 52 possess a recess surface 53 having a ½ inch radius.

The upper jaws 50 include a sloped surface 55 which facilitates sliding of the conductor 32 into recessed surface 51 during installation of the unit 30 on the conductor 32, and also protects the conductor temperature probe 92 from being contacted on the side by the conductor 32. The conductor 32 slides down sloped surface 55 and is directed beneath the lower extremity of the temperature probe 92. The temperature probe 92 is easily pushed upwardly by the conductor 32 if the conductor 32 first contacts the probe 92 on the bottom, rather than on the side.

The radial thickness of the jaws 50, 52 is preferably selected such that the heat loss for the bare conductor 32 is the same as the heat loss for that portion of the conductor 32 under the jaws 50, 52. This optimum condition is also facilitated by the fact that the jaws 50, 52 are staggered relative to each other. This arrangement provides the maximum amount of the conductor 32 to be exposed to the ambient conditions. Additionally, the jaws 50, 52 must be able to withstand a surface conductor temperature ranging from 125° C. to 175° C. on a continuous basis, have a high compressive strength and low coefficient of thermal expansion, exhibit low flammability and water absorption and display arc resistance characteristics. One material suitable for this purpose is Teflon FEP. Since the conductor temperature probe 88 is grounded to the conductor 32 or is at the same electrical potential as the conductor 32 and its shield is grounded to the housing 35, the dielectric strength of the jaw material is relatively unimportant. Clearance is provided between the upper and lower jaws 50, 52 in order to allow for a certain amount of "crush" (the conductor 32 becomes somewhat elliptical in shape when the jaws 50, 52 are tightened).

The electrical components of the sensor-transmitter unit 30 are driven by a power supply which derives power from the electromagnetic field of the monitored transmission line conductor 32. The power supply comprises the two identical, nested "j" shaped magnetic core portions 102, 104 (FIG. 12) previously discussed and the coil 100. The upper core portion 102 is inverted with respect to the lower core portion 104 and is fixedly secured to the housing half 34b. One set of extremities of each core portion 102, 104 are radiused at 107, 109 so that the opposing extremities of core portions 102, 104 overlap each other by a distance "x", when the jaw 52 is in closed clamping position. With the core portions 102, 104 overlapping each other air gaps 111, 113 are defined at the overlapping areas through which magnetic flux is coupled from one core portion to the other. The lower core portion 104 is secured to the clamping block 132 and is therefore movable along with the opening and closing mechanism shown in FIGS. 13 and 14. Since the lower core portion 104 is attached to the opening and closing mechanism, the lower jaw 52 may be employed on a range of conductor diameters, yet the magnetic properties of the air gaps remain unchanged because the areas of the air gaps remain constant regardless of the position of the lower core portion 104. The outer extremities of the core portions 102, 104 include tapered surface areas 106, 108, respectively, which function to slideably engage the opposite ends of the core portions, thereby automatically aligning the end of the core portions to assure that tight magnetic coupling occurs between the core portions. When the lower jaw 52 is closed on the conductor 32, the magnetic flux passes from the upper core portion 102 to the lower core portion 104 via an air gap 111 contained in the cover sleeve 36 and then passes from core portion 104 into core 102 via air gap 113 defined within the column 40. This arrangement requires that each core portion 102, 104 consist of stacked laminations of non-oriented flat rolled electrical steel so that the laminations of each core portion are parallel to one another in the air gap areas. The inside cross-sectional area of the core cover sleeve 36 allows precise alignment of both core portions 102, 104 with their longest dimension adjacent the air gaps 111, 113. This ensures proper alignment and a tight air gap (FIG. 13a). Additionally, the core cover sleeve 36 prevents the core portions 102, 104 from producing corona and protects the air gap from the environment. The electronic components and transmitter of the unit 32 are powered from the current flowing through the conductor 32 when such current exceeds a threshold value which is typically between 120 to 150 amperes. This relatively high value of primary current is not limiting as a practical matter since, during zero wind conditions (worst case) the conductor temperature cannot be distinguished from ambient temperature when 200 amperes is applied to a 1 inch diameter conductor. The threshold value of current can be lowered for smaller conductor sizes by reducing the number of turns on the secondary winding of the power transformer coil 100.

The power supply for the unit 30 includes the transformer previously discussed (consisting of the core 102, 104 and coil 100) a diode bridge (FIG. 28), a solid state switching network and two large electrolytic capacitors 118 for storing a portion of the energy derived from the transformer secondary. As will be discussed later in more detail, the switching network senses the DC output of the diode bridge and shorts out the secondary winding of the power supply transformer when the voltage on the secondary of the diode bridge reaches a preselected value. A test receptacle 204 (FIGS. 7, 10 and 28) mounted within the housing half 34b between the jaws 50 and near the column 40, provides means for powering the unit for testing, calibration, etc.

Figure 16:
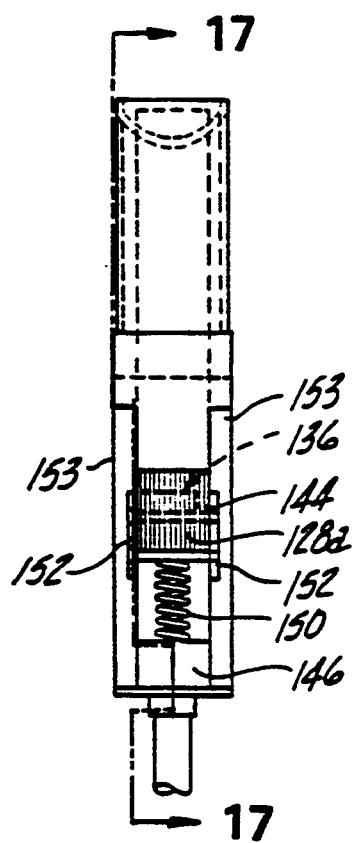
FIG. 16 is a front view of the jaw opening and closing mechanism shown in FIG. 15.

Attention is now directed to FIGS. 15, 16, and 17 which show a core 128 similar to that shown FIG. 12 but which is formed from wound laminations of oriented steel. With this arrangement, the lower core portion 104 must move with respect to the jaw opening and closing mechanism. A core of this type may be easily formed by winding electrical strip steel over a mandrel and requires less time to manufacture than the stacked laminated cores shown in FIGS. 10 and 12. The core 128 is formed by cutting the wound "O" shaped laminations and lapping the cut ends to create a small air gap. The lower portion 128a of the core 128 is shiftably mounted on a clamping block 146 of the opening and closing mechanism by means of a pair of spaced apart compression springs 150. The lower core portion 128a is held in alignment with upper core portion 128b by placing the lower core portion 128a to the right of the center line (FIG. 15) of the core cover sleeve 36 and clamping a core key 152 on the the lower core portion 128a adjacent the clamping plates 153. One side of the core key 153 consists of an electrical insulating material to eliminate a shorted turn around the core 128. The springs 150 are received within cylindrical spring holders 148 which in turn are threadably received in the clamping block 146. Potation of spring holders 148 adjusts the force created by the springs 150 so that the lower core portion 128a is held firmly against the underside of the retainer stop 136; in this manner, the lower core portion 128a is maintained level. Once the two halves of the core 128 are together and a magnetic flux flows therethrough and between the air gaps 127, it is no longer necessary for the springs to force the core portions together since the magnetic attraction provides the necessary attactive force.

The RF antenna 13 of the sensor-transmitter unit 30 functions both to transmit radio signals at the appropriate frequency, for example in the UHF band and forms a guide for receiving the hot stick tool 166. Additionally, the antenna tube 46 functions to laterally support the unit 30 in a vertical position when the hot stick tool 166 is employed to install or remove the unit 30. The antenna 13 is essentially a half wave dipole grounded at its center. The center of the driven element is not intermediate at the ends of the tube 46, but rather is at the base 45. Since there is no RF voltage at the center of the half wave dipole, the outer conductor of the coaxial cable from a later discussed UHF transmitter is grounded at the top of the antenna.

The inner conductor, carrying the RF current is tapped out on the driven element at the matching point using bronze sphere 74 or a matching tap. The inductance of the copper arm 72 is tuned out by means of a tuning capacitor 206, resulting in electrical balance. Both the point of contact with the driven element and the value of the capacitor 206 are adjusted for zero reflected power. The capacitor 206 is made variable until the antenna 13 is tuned and then is left as a fixed value. The arm 72 is insulated from the housing 35 by means of a nylon bushing 73. The capacitor 206 and arm 72 could be combined into a single assembly with the arm 72 being attached to the driven element by the matching tap and the arm sliding inside a sleeve connected to the inner conductor of the coaxial cable. Once the match is obtained, the voltage across the capacitor 206 is low, therefore insulation is no longer a problem. Since the RF current is high between the arm 72 and the driven element, the matching tap is constructed from a bronze sphere 74 which attaches the arm to the driven element by means of a brass machine screw 75 so as not to create a source of corona. The side of the bronze sphere 74 adjacent to the driven element fits the contour of the 2 inch aluminum tube 46 and ensures a permanent high conductivity connection. Because of the smooth shape of the matching tap and its close proximity to the antenna base 45, no corona sources are produced with this matching device. The sphere 48 at the bottom of the tube 46 is hollow and can be formed of aluminum. The sphere 48 functions to eliminate sources of corona from the antenna 13.

The method of matching the antenna element is based upon the fact that the impedance between any two points along a resonant antenna is resistive. The antenna length is first adjusted for approximate resonance which for the UHF band is about 6.5 inches. The distance between the surface of the antenna 13 and the arm 72 is set at approximately 0.25 inches to minimize corona. The matching tap is then adjusted up or down while maintaining the same lateral distance from the antenna until the standing wave ratio is as low as possible. When the series capacitor method of reactance compensation is used, various positions of matching taps are tried after the resonant length of the antenna is established. For each trial matching tap position, the capacitor is adjusted to achieve minimum SWR (standing wave ratio) until the standing waves are reduced to the lowest value. The SWR for the illustrated design is nearly 1:1.

The antenna 13 is held in place with two dowell pins 45a secured to the antenna base 45, as shown in FIG. 10. When the housing halves 34a, 34b are assembled together, the dowell pins 45a extend into both housing halves 34a, and 34b. This arrangement provides for secure mounting of the antenna 13, yet facilitates easy assembly and disassembly.

This simple antenna design possesses a number of advantages. First, it is applicable to a broad band of UHF frequencies, provides a horizontal omnidirectional radiation pattern, transmits signals to a receiver up to a distance of between 6 and 10 miles, and its rugged construction allows it to be used as a guide for a hot stick tool. In addition, the antenna 13 is corona protected and grounded at a power line frequency of 60 hertz.

As will be later discussed, the corona sphere 13 may be adapted for use in sensing wind velocity and direction.

The housing 34 is well ventilated by virtue of the access holes 67, a ventilation hole 54 in housing 34 and ventilation slots, 110, 112 in the associated housing halves 34a and 34b. Ventilating air enters the holes 54 then passes through the louvers 68, enters the compartments 58 and 60 to cool the electronic components therein, is diverted by plates 78a, 80b and finally exits through the ventilation slots 110 and 112 which, as best seen in FIG. 8, are angled downwardly so as to prevent ambient moisture from entering the housing 34 therethrough.

The unit 30 is normally installed at midspan of the conductor 32 since the wind velocity will usually be lower at the lowest point on the conductor 32. However, the wind may be lower at other locations, since trees, irregular terrain and obstructions may shield the conductor 32 so as to operate at higher temperatures than at midspan. In any event, the unit 30 may be mounted at an appropriate location along the transmission line 32 without the need for interrupting the current therethrough. Before installing the unit 30 on the conductor 32, it is important to clean the conductor 32 and apply an aluminum conductive grease thereto since transmission line conductors normally become oxidized rather quickly even in clean environment.

A suitable clamping device 180 mounted on the end of an insulated rod or hot stick 182 may be used to assist in the installation of the unit 30 on the conductor 32. The opening and closing wrench 166 may then be inserted into the antenna tube 46 until the transverse pin 137 on the lead screw 138 is in the bottom of the slot 170 of wrench tool 166. With the lower jaw 52 in a fully open position, hot stick 172 is used to lift the unit 30 onto the conductor 32 by passing through opening 37 until the upper jaws 50 rest upon the conductor 32. The lead screw 138 is then turned in order to move the lower jaw 52 upwardly into contact with the conductor 32. At this point, the conductor 32 is tightly gripped between the jaws 50, 52 and the unit 30 is secured in place. Once the weight of the unit is transferred to the conductor 32, hot stick 182 may be removed. The purpose of the horizontal groove 168 in the tool 166 is to engage the transverse pin 137 so that the tool 166 does not accidently fall out as long as it is turned in a clockwise direction. To release the tool 166 from the transverse pin 137, the tool 166 need only be turned counter clockwise slightly, and thereafter the tool 166 may be removed.

As shown in FIGS. 4, 4a, 4b, 6, 6a and 7, a solar radiation sensor 124 may be optionally provided in order to measure the solar radiation impinging on the surface of the transmission line 32. The radiation sensor 124 may comprise eight silicon solar cells 123 assembled in an array and mounted on the top of a raised section 310 on the extension 42, immediately above the power supply compartment 42a. The 1 cm by 2 cm silicon solar cells may be obtained from Sensor Technology, Part No. ST-100. Silicon cells are preferred since they respond to wave lengths which represent most of the energy from the sun and also possess high conversion efficiency, temperature stability and lack of fatigue. The cells may be connected in parallel and shunted with a low value calibrating resistor, or connected in series with each cell shunted with a resistor to maintain the cell output to a voltage less than 100 millivolts. When the cells are electrically connected in parallel, each cell operates as an independent current source whose output varies linearly with light intensity. The low load resistance allows the solar cells to respond quickly to transient conditions (clouds passing) and nullifies changes in cell output due to ambient temperature variations.

The solar cells are mounted in an aluminum enclosure 125 or other electrically conductive, electric field shielding material, The cells are completely encapsulated in a clear silicon potting compound 241 which minimizes solar radiation reflections and electrically insulates the cells from the aluminum housing 125, and the special glass cover 126 overlying the cells 123, The potting compound serves as a thermal barrier to protect the cells from heat being trapped in an air layer between the cells 123 and glass cover 126. The glass cover 126 may comprise Nesatron glass which is coated with electrically conductive tin oxide, such as that available from PPG Industries. The glass cover 126 eliminates the corona or electrical discharge from the surface of the solar cells 123 while the cell is operating in the high electric field of a transmission line. The glass cover 126 is chamfered around its perimeter at an angle of 45 degrees and is cemented to the aluminum solar cell enclosure 125 with an electrically conductive material 242. Thus, the corona current, created by the presence of high voltage on the glass 126, flows along a path on the outside surface of the glass and through the electrically conducting cement to the enclosure 125 and then to ground, rather than from the enclosure 125 through the cell 123 to ground. Since the inside surface of the glass cover 126 is also electrically insulating, the cell 123 is not subjected to currents capable of causing cell failure. The electrically conducting material not only bends the glass cover 126 to the enclosure 125, but also allows for differences in the thermal expansion and contraction between the aluminum and the glass. It should be noted here that the cells 123 could also be shielded by a fine electrically conducting screen which is electrically insulated from the cells but is bended electrically to the aluminum enclosure 125. The cells 123 are laterally spaced from the walls of the aluminum enclosure 125 so that the cells are fully illuminated by the sun when the sun rays are 18 degrees above the horizon on the back and front of the enclosure 125 and are 16 degrees above the horizon on the sides of the enclosure 125.

As shown in FIG. 15, an additional sensor 243 may be provided in the unit 30 for sensing the magnitude of the current in line 32 in order to compute real-time thermal ratings. However, the conductor current is usually measured and recorded at the line termination point, i.e., station or substation, therefore it may not be necessary to measure line current with sensor-transmitter unit 30. Measuring line current with the unit 30 is convenient in those applications where the units are periodically moved from one line to another, and it eliminates the need for installing signal conditioning circuitry to convert the high currents from station current transformers to low level signal outputs. The power supply transformer of the unit 30 cannot be used to monitor the line current, because the secondary winding is periodically shorted by the switching network. However, a current sensing circuit maybe provided for sensing the charging time for the capacitors 118 since this charging time is directly related to the magnitude of the line current. Alternatively, an unstitched secondary winding 243 may be added to the power supply transformer core 128 (FIG. 15). The output of this current transformer may be delivered to a hall effect device current tranducer, such as that manufactured by Scientific Columbus, Model 4034; this device provides a linear DC output proportional to the line current which may then be converted to a DC voltage by shunting a resistor across its output.

A sensor in the nature of an inclinometer 84 may be provided to measure magnitude of sag of the conductor 32. The inclinometer 84 measures the slope angle of the conductor 32 at the point of attachment of the unit 30 to the conductor 32 and calculates the conductor sag from computer algorithms which describe a typical catenary curve. One suitable inclinometer is manufactured by Schaevits, model LSOC-30. The inclinometer 84 is self contained, magnetically shielded and is designed to be operated from a 15 volt DC power supply. The output of the inclinometer 84 is an analog DC signal which is directly proportional to the sine of the angle of tilt. The inclinometer 84 is mounted with its sensitive axis parallel to and above the conductor 32. Because the sensitive axis of the inclinometer 84 is positioned between the two upper clamps 50, small changes in angle created by strong winds blowing parallel to the conductor and perpendicular to the right or left side of the unit 30 will only marginally affect the measured sag. The device 30 accurately measures the actual sag with the wind blowing transverse to the conductor 32 since the sensitive axis will not be affected by rotation of the unit 30 about the axis of the conductor 32.

The angle $\theta$ measured by the inclinometer 84 is the angle between a pendulum and a line perpendicular to the conductor 32. This angle is used to calculate the sag in accordance with the equation:

$$\text{Sag} = a\left(\frac{1}{\cos\theta} - 1\right)$$

where the constant "a" is the ratio of the horizontal component of conductor tension to the distributed conductor weight per unit length; the quantity may be easily calculated by measuring the sag and the angle of inclination when the device in installed on the conductor. The above equation may be used for calculating the sag for a level conductor span, however sag can also be calculated when the points of attachment of the conductor 32 are at different elevations above ground.

The inclinometer 84 is easily calibrated while the line 32 is energized by using the adjustment screw found on the front of the unit 30 and a screw driver attachment on the hot stick; this feature improves the accuracy of the inclinometer 84, in that a differential inclination measurement can be made using the existing transmission line sag as the zero reference angle. This is accomplished by providing a mechanical zero adjustment which orients the inclinometer so that zero volts is output when the unit 30 is on the conductor 32. The gain of the electronic circuit used to process the signal is chosen to provide full-scale output indication for the maximum calculated change in conductor slope angle to be expected on a particular span.

Attention is now directed to FIGS. 18 through 21 and 26 which depict means for sensing the velocity and direction of wind flowing over the the monitored conductor 32. As described earlier, the present system uses the parameters of conductor temperature, conductor current, ambient temperature and solar radiation to define the thermal state of the conductor. However, the conductor has a thermal time constant, thus the existing conductor temperature is dependent upon the wind velocity and direction, ambient temperature, solar radiation and line current conditions which occur typically, 5 to 10 minutes earlier. Measurement of wind velocity and direction on a real-time basis is important since these parameters may be quite variable in contrast to ambient temperature and solar radiation which are rather stable and produce small changes in the conductor temperature. Therefore, if the wind velocity and direction are measured, then more accurate future conductor temperatures can be predicted or forecasted. Real-time measurement of the wind velocity and direction is also useful for predicting the occurence of conductor vibration and galloping, and the unit 30 can be used to measure the amplitude of the galloping since it also measures conductor sag.

Figure 21:
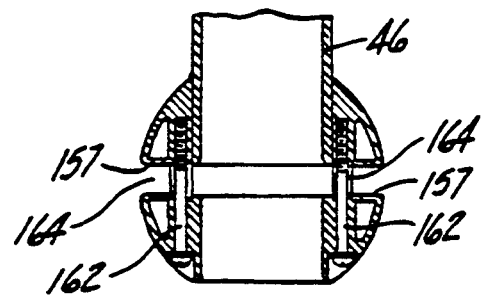
FIG. 21 is a sectional view taken along the line 21—21 in FIG. 20.

The wind sensor comprises a plurality of small, electrically heated wire elements 160 which are circumferentially spaced around the longitudinal axis of the antenna tube 46 in a manner which exposes the wire elements 160 to the free stream of air uninterrupted by the unit 30, but protects the wire elements from corona. The wire sensors 160 typically may range from 0.00015 to 0.0005 inches in diameter and 0.040 to 0.080 inches in length. A later discussed circuit supplies a controlled quantity of electrical current to heat the sensing elements 160 and thereby maintain them at constant temperature regardless of wind speed. In order to shield the sensing elements 160 from the high electric field produced by the conductor 32 without affecting the free stream of air flowing past the sensing elements 160, a novel mounting arrangement is provided which will now be described. The corona reducing antenna sphere is divided into an upper half 154 and lower half 156 which are spaced apart from each other to form a circumferentially extending, horizontal opening 158. A pair of parallel, spaced apart, annular mounting plates 157 are respectively secured to the sphere halves 154, 156 within the opening 158. As best seen in FIG. 21, a plurality of circumferentially spaced screws 162 and sleeves 164 connect the mounting plates 157 with each other and thereby mount the lower half of the sphere 156 to the upper half 154. The sensing elements 160 extend through the mounting plates 157 and are spaced at 90 degree intervals relative to each other in order to sense air flowing through the space 158 from different directions.

Figure 18:
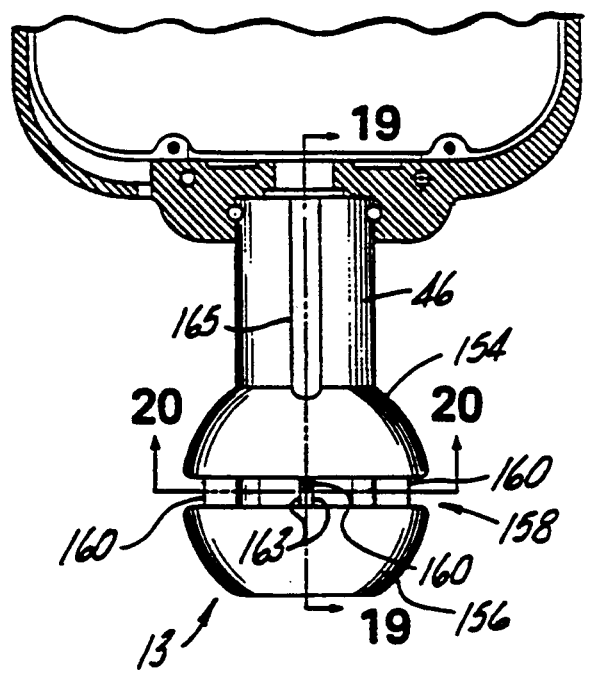
FIG. 18 is a fragmentary, elevational view similar to FIG. 15 but showing another form of the antenna employing means for sensing the direction and velocity of the wind.
Figure 20:
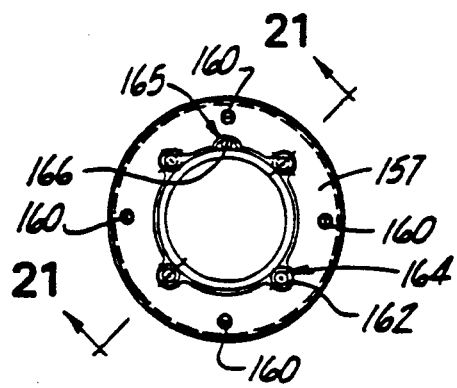
FIG. 20 is a sectional view taken along the line 20—20 in FIG. 18.

It is important that the air space 158 not be too small since the free stream of air flow over the sensing elements 160 will be disrupted, however, the space 158 should not be too large since the sensing elements 160 could be damaged by corona. The spacing 158 between the mounting plates 157 as well as the radial spacing of the sensing elements 160 from the central axis of the tube 146 will vary depending upon the voltage level of the transmission line and the desired accuracy of the wind velocity measurement within a specific range thereof. As shown in FIG. 18, shrouds 163 are provided adjacent each sensing element 160 in order to shield these elements from electric fields as well as from heavy rain or sleet.

The sensing elements 160 are connected by lines 166 to a later discussed bridge circuit. The leads 166 extend upwardly along the tube 46 into the housing 35 and are protected from corona by a shield 165.

A single horizontally oriented sensing element 160 will provide an indication of the wind cooling velocity on the conductor, but will not provide an indication of wind direction. ]Both wind velocity and direction may be determined by employing two sensing elements 160 which are oriented in a cross or "X" pattern so that the components of the output voltage from the sensing elements 160 will be indicative of both the direction and magnitude of the wind. The stainless steel cover 165 is placed over the sensor element leads 166 to shield the leads from the magnetic fields. Alternatively, the sensing elements 160 may be mounted on top of the raised portion 310 of the upper extension 142.

In the preferred form of the invention, a constant temperature type sensing circuit is employed in connection with the hot wire sensing element 160, including a feedback loop. Current flow is measured by the heat loss from the hot wire element 160 which has a low thermal inertia. A sensing probe containing hot wire element 160 forms one leg of a balanced wheatstone bridge indicated at 188 in FIG. 26. Any change in the resistance element 160 caused by cooling due to the wind immediately produces an out-of-balance voltage in the bridge 188. This voltage unbalance is passed through a high gain operational amplifier 184 which increments the supply voltage V until balance is achieved. If the amplifier 184 has sufficient gain it will maintain its inputs close to a balanced condition. Any change in the resistance of the sensor 160 will be corrected by a decrease or increase in the current through the sensor 160. The output is the voltage output of the amplifier 184, i.e., the voltage required to drive the current through the sensing element 160. The voltage across the bridge 188 is directly proportional to the current through the sensor 160, and the power is equal to $I^2_2 R_2$, consequently the square of the voltage at the top of the bridge is directly proportional to the heat transfer between the sensor 160 and the ambient environment. The wind velocity is proportional to the effective cooling. Since the ambient temperature of the wind varies between calibration and measurement, the influence of temperature on the sensing elements 160 must be considered. The correction for ambient temperature changes is easily accomplished since the ambient temperature of the air flow is already being measured by the sensor 86. The wind flow data is corrected by comparing calibration data taken at different temperatures with the measured ambient data.

Figure 28:
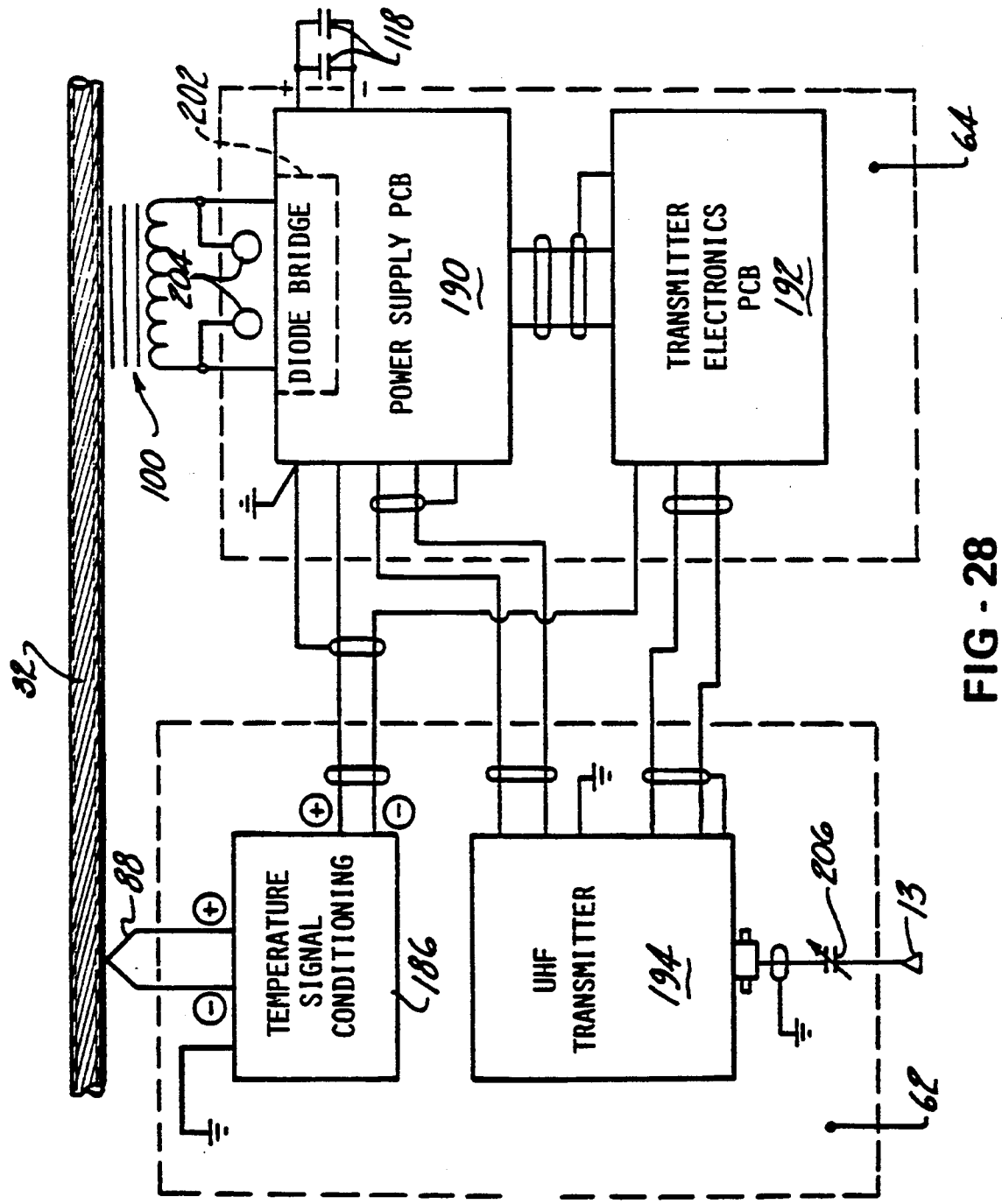
FIG. 28 is a diagrammatic view showing the circuit components which are mounted on the cover plates of the sensor-transmitter unit.

Attention is now directed to FIGS. 27 and 28 which disclose in more detail the electronic components forming a part of the sensor-transmitter unit 30. Referring to FIG. 27, the transmitter electronics 192 (FIG. 28) comprises a voltage-to-frequency converter 196, a divider 198 and a frequency shift keyed (FSK) modulator 200. The temperature signal conditioning circuit 186 functions to convert the information from the thermocouple or intergrated circuit temperature transducer forming the temperature sensor 88 to an analog signal which is proportional to the temperature of the conductor 32.

The voltage-to-frequency converter 196 may comprise, by way of example, a National Semiconductor LM 131 and produces an output pulse train which is proportional to the input voltage applied thereto by the signal conditioning circuit 186. The divider 198 may comprise a Motorola Model MC 4020 and reduces the frequency of the signal output from the converter 196 to 1/16th of it original value. The FSK modulator 200 is a conventional item employed in transmitting data over telecommunication links and functions to generate modulating frequencies which ensure exact reproduction of the transmitted signal. The UHF transmitter 194 is also a conventional device such as a two watt Repco 819-series or a Motorola CISCO.

The conditioned signal indicative of the temperature of conductor 32 is delivered to a digital display 78 which may be of the LED or LCD type. In a similar manner the ambient temperature sensed by sensor 86 is displayed on a display 80. As best seen in FIG. 8, the displays 78, 80 are mounted in the sides Of the housing halves 34a and 34b and are angled downwardly so as to be viewable from below the unit 30. The conductor temperature signal is processed by the transmitter electronics 192 and is delivered to the transmitting antenna 13 through transmitter 194 and a tuning capacitor 206.

The electronic circuits for the unit 30 which monitor the temperature of the conductor 32 are mounted on a plurality of printed circuit boards (PCB's) which in turn are secured to the inner faces of cover plates 62 and 64. As shown in FIG. 28, an electrical circuit forming part of the power supply is defined on a printed circuit board 190 which in turn is connected with power supply transformer 100. The electronic circuit forming a part of a UHF transmitter 194 is mounted on a second printed circuit board 192. PCB'S 190 and 192 are mounted on the interior face of the cover plate 64. A temperature signal conditioning circuit 186 is connected with the temperature sensor 88 and is mounted on cover plate 62 along with a UHF transmitter 194.

The power supply for the unit 30 provides a relatively constant voltage and power to the electronics even though the primary current in the conductor 32 may range from 100 to 2000 amperes under steady-state conditions and 20,000 to 30,000 amperes for transient conditions. If the secondary of the transformer was open circuited, all primary current in the conductor 32 would become magnetizing current and the transformer core would be driven into saturation, thus producing very high secondary voltages, typically several thousand volts. Conversely, if the secondary of the power supply transformer 100 was not open or short circuited, the excess power at high primary currents would cause excessive heating of the core and coil, and consequently errors in the measured conductor temperatures. The present invention employs a switching network which only allows a predetermined power and voltage to be derived from the power supply transformer.

The power supply for the unit 30 broadly comprises the power supply transformer 100, a diode bridge 202, solid state switching network and a pair of electrolytic capacitors 118 to store a portion of the energy derived from the transformer secondary. The diode bridge 202 and solid state switching network are defined on the PCB 190. The power supply switching network senses the DC output of the diode bridge 202 and shorts out the secondary winding of the power supply transformer 100 when the voltage on the secondary of the diode bridge 202 reaches a first value. When the voltage across the capacitors 118 drops to a second value below the first value, the switching network unshorts the winding and allows the voltage again to climb to the first value. This process repeats itself and results in the storage of energy in the capacitors 118, which in turn supply the electronics and the transmitter 194 with a relatively constant DC voltage and power, and the transformer core thus never saturates even for high values of line current.

In order to provide power to the unit 30 when it is disconnected from the conductor 32 for purposes of calibration checks on the various sensors or the like, a suitable AC voltage source may be connected with the test receptacle terminals 204, which are in turn connected to the secondary of the transformer 100.

Figure 29:
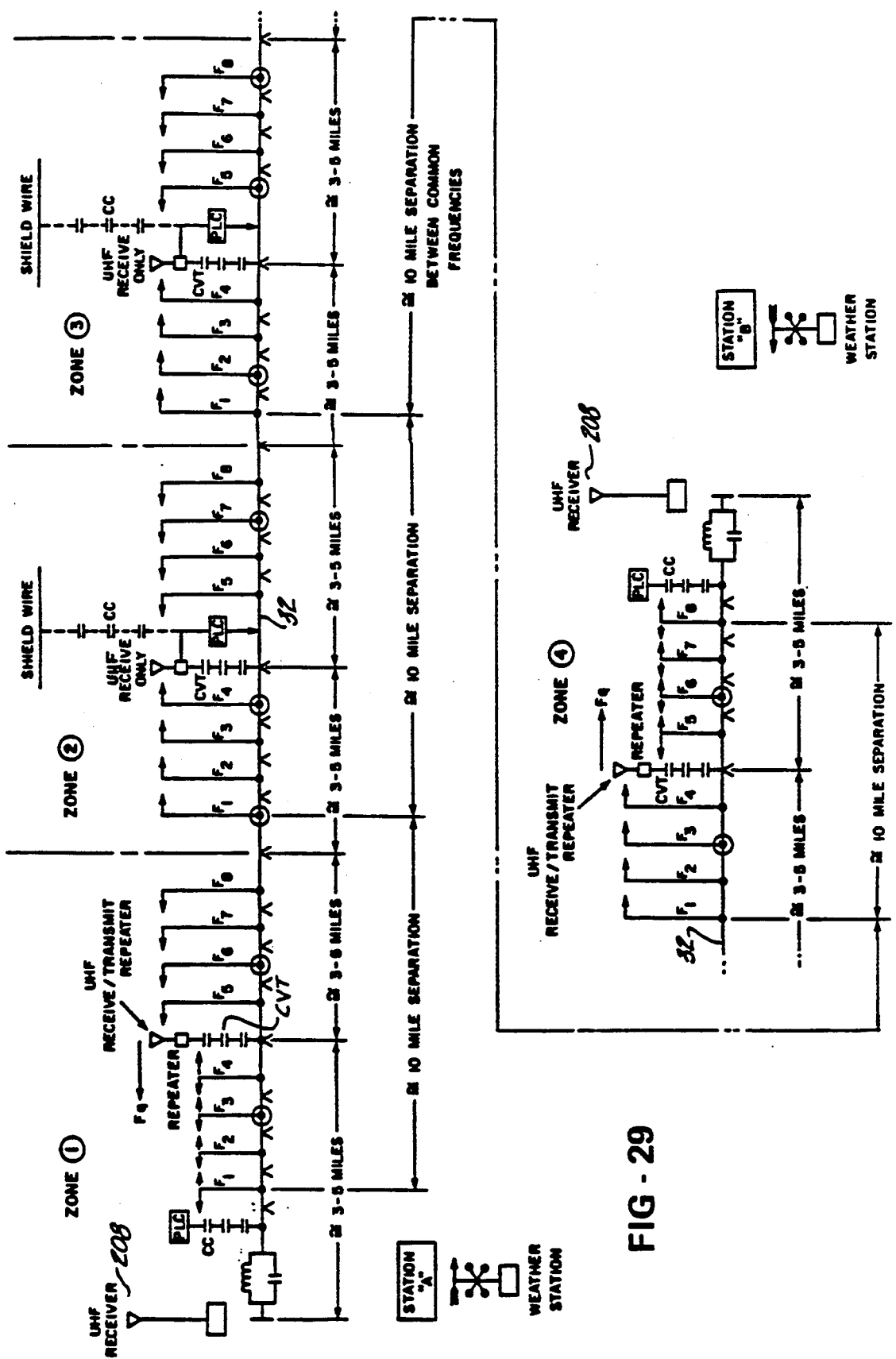
FIG. 29 is a diagrammatic view of a 40 mile power line employing the system of the present invention.

Attention is now directed to FIG. 29 which diagrammatically depicts the use of a plurality of the sensor-transmitter units 30 in a system for monitoring a 40 mile length of transmission line 32. Four of the sensor-transmitter units 30 are mounted on each of a series of three to five mile stretches. The forty mile transmission line 32 is divided up into four zones of ten miles each which include 8 of the units 30, frequencies ($F_1$–$F_8$). Sensor-transmitter units which are dedicated to sensing conductor temperature are indicated as connected to the line 32 with a dot while units capable of sensing multiple parameters such as ambient temperature, conductor temperature, solar radiation, current, wind and conductor sag are indicated by an encircled dot. Zones 1 and 4 include a UHF receive/transmit repeater which is powered from a capacitive voltage transformer (CVT) connected to the line 32, while Zones 2 and 3 include UHF receivers powered by a CVT connected to line 32. A UHF receiver 208 is connected at each end of the line 32.

Data from the sensor-transmitter units 30 may be transmitted using different UHF frequencies ($F_1$, $F_2$ ... . $F_3$) or a single frequency. The processing electronics for those units 30 which sense multiple parameters is capable of coding a digital signal with seven multiplexed inputs into a frequency shift keyed audio tone. The unit serially transmits between 1 to a maximum of 7 channels of information on one frequency. The input signals are processed for any necessary gain changes and are then multiplexed. The analog multiplexer selects each channel of an analog input in sequence on command from an encoder. Each selected analog channel is then digitized by the analog-to-digital convertor and Is transferred In digital form to an encoder. The encoded digital signal is then converted to audio frequency shift tones by the frequency shift transmitter. An appropriate matching pad is installed between the FSK transmitter output and the input to the UHF transmitter. An expander is necessary only when multiple units are used on the same frequency.

The input parameters from each unit 30 may be separated by using different RF carrier frequencies for groups of transmitters. In those cases where it is difficult to obtain the required number of licensed frequencies, time sequencing, that is sychronizing to the power line frequency, is an alternative approach to transmitting the information and is the preferred method for separation between units on the same carrier frequency. Receiving stations "A" and "B" are positioned adjacent the respective ends of the transmission line 32. The data from the units 30 may be transmitted to these stations in any of several ways. Those units 30 within approximately five miles of the corresponding station at the end of the line 32 may transmit directly to the UHF receiver associated with that station. Those units 30 within Zones 1 and 4 which are six to ten mile away from the station may transmit to a UHF repeater installation. If only one UHF frequency is used for all of the units 30, then another frequency is required for the repeater station. The units 30 within Zones 2 and 3 transmit UHF signals to a power line carrier (PLC) installation which injects the time sequenced signals into the transmission line phase wire or conductor 32, through the use of the capacitive voltage transformer (CVT). The CVT also provides power to the UHF, receiver/PLC transmitter by capacitive coupling to the phase wire. Signals may also be injected using PLC techniques with the ungrounded shield wire mounted on top of the transmission line structure. The advantage of this method is that equipment maintenance can be performed without the transmission line being shut down.

Figure 30:
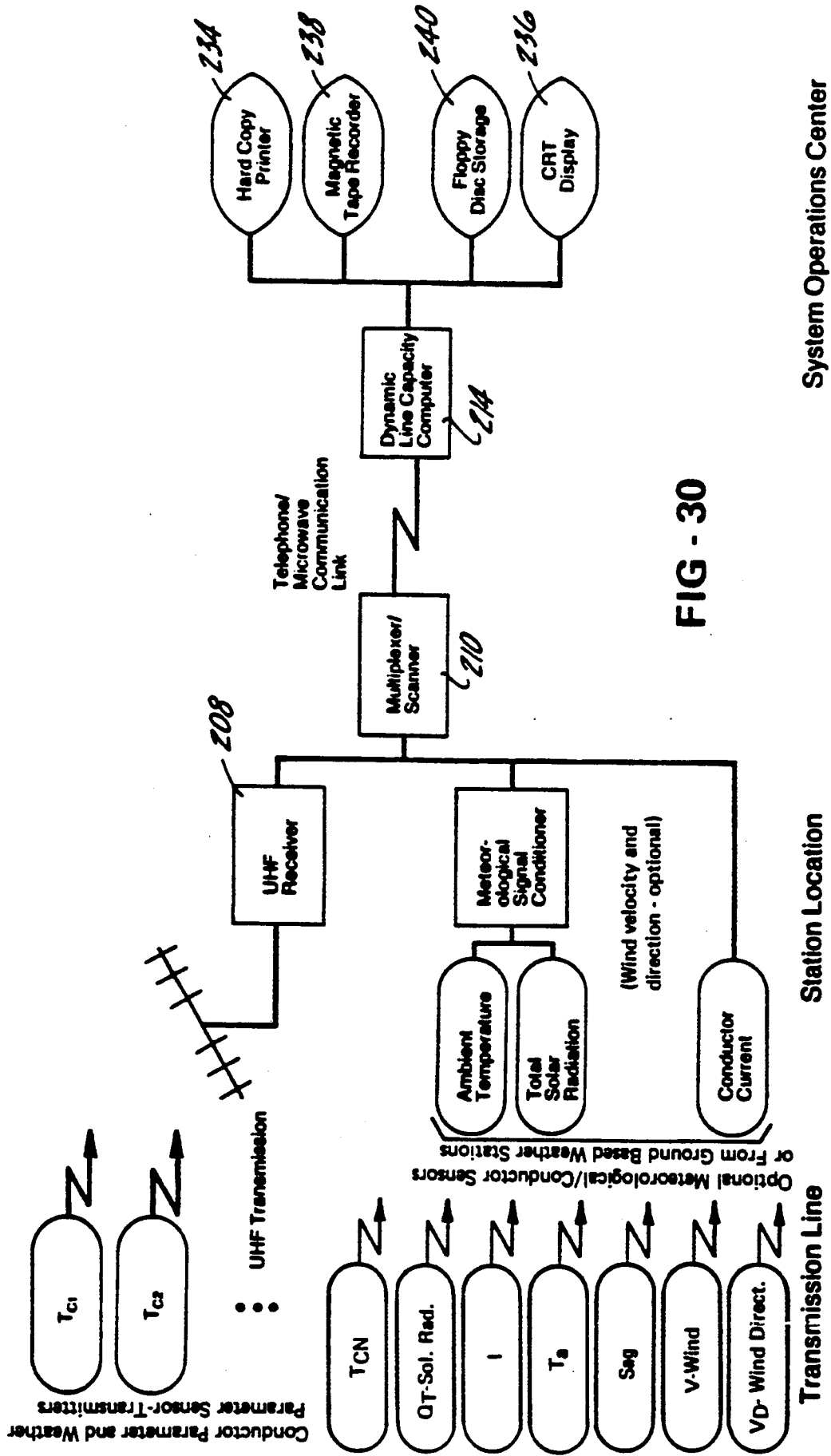
FIG. 30 is a block diagram of the broad components of the system of the present invention.

Reference is now made to FIG. 30 which depicts the overall component parts of the system of the present invention. The sensor transmitter unit 30 which senses conductor temperature and up to 7 parameters transmits signals to a UHF receiver 208 which typically may be located in a power substation along with a mulitplexer/scanner 210 as indicated previously, alternatively however, these signals may be transmitted to the substation using PLC signals through the transmission line 32 itself. Additional sensor-transmitter units 30 along the line 32 may also transmit real time data relating to conductor temperature, ambient temperature, solar radiation, wind velocity and direction, conductor current and line sag to the substation location, or alternatively conductor temperature may be monitored on the line while ambient temperature, solar radiation, wind velocity, wind direction and line current data may be obtained directly at the substation using one of the units 30 or a remote weather station if the line is short. The real-time data received from the units 30 at the substation is scanned at a preselected rate, converted from analog to digital form and is then multiplexed to a systems operation center via shy suitable telecommunication link such as telephone, microwave, etc. The data received through the communication link at a systems operation center is input to a dynamic line capacity computer which may comprise by way of an example a microcomputer system 214 that performs real-time calculations using the received data. The computer 214 includes a special software program for performing the calculations, a simplified flow chart for the program being shown in FIG. 31. The computer 214 first determines the validity of the data at 216 and employs a transmission line data file 218 in order to first determine at 222 the safe capacity for each monitored span of the transmission line 32. The span of the transmission 32 with the lowest computed current is calculated at 224 and is identified as the "critical span". Having identified the critical span, the resultant calculated current becomes the maximum transmission line capacity. The computer operator can then select load levels higher than the steady state capacity for the "critical span" and direct the computer 214 to predict at 226 the time required for this span to reach its safe conductor temperature. These load levels may be greater or less than the design rating thereof. Using the computer 214, the operator can determine when loads greater than design rating can be carried safely, or conversely, when loads less than the design rating cannot be carried without exceeding the safe conductor temperature. This feature becomes the distinct advantage for the operator during major system outages; knowledge of the thermal state of the transmission line can prevent opening lines unnecessarily and weakening the transmission grid. The monitored and calculated data is converted to graphical form at 228. Graphical display of the data may be achieved using a hard copy printer 234 or CRT 236 shown in FIG. 30. Data from a conventional rating file 220 may be combined with the data identifying the critical span at 224 to form a capacity table 232, similarly, the critical time calculated at 226 may be employed to create a critical time table 230. Operating data may be permanently stored on a magnetic tape recorder 238, floppy disc 240 or other suitable storage media (FIG. 30).

For purposes of providing a complete description of the present invention, reference is made to a listing of one suitable program for use in the present system which is contained in an Application for Copyright Registration filed in the U.S. Copyright office on Jun. 13, 1984 and identified by Certificate of Copyright Reg. No. TXa 169-608, the entire contents of which is hereby incorporated by reference herein.

In view of the foregoing, it is apparent that the system described above not only provides for the reliable accomplishment of the objects of the invention but does so in a particularly effective and economical manner. It is recognized, of course, that those skilled in the art may make various modifications or additions to the preferred embodiment choosen to illustrate the invention without departing from the spirit and scope of the present contribution to the art. Accordingly, it is to be understood that the protection sought and to be afforded hereby should be deemed to extend to the subject matter chimed and an equivalents thereof fairly within the scope of the invention.

I claim:

1. A method for monitoring the current carrying capacity of a length of an overhead electric power line, which includes a plurality of overhead electric power line spans supported above the ground, comprising the steps of:
   a. positioning a monitoring device for monitoring the distance between the ground and the overhead electric power line on at least one span of the length of said overhead electric power line in such a way as to not significantly affect the distance between the ground and said at least one span;
   b. monitoring on a real-time basis the distance between the ground and said at least one span of the length of said overhead electric power line;
   c. generating data signals at the monitored spans corresponding to the monitored distance between the ground said at least one span;
   d. determining the current carrying capacity of said electric power line span using at least the data signals generated in step (c).

2. The method of claim 1, wherein the distance between the ground and said at least one span is calculated by measuring the actual sag in said at least one span by said monitoring device.

3. The method of claim 2, wherein said monitoring step is performed by continuously sensing the slope of said overhead electric power line along said at least one span and generating data signals in response thereto.

4. A method for monitoring the current carrying capacity of a length of an overhead electric powerline, which includes a plurality of overhead electric power line spans supported above the ground, comprising the steps of:
   a. positioning a monitoring device for monitoring the distance between the ground and the overhead electric power line on at least one span of the length of said overhead electric power line in such a way as to not significantly affect the distance between the ground and said at least one span;
   b. monitoring on a real-time basis the sag of said at least one span to determine the distance between the ground and said at least one span of the length of said overhead electric power line, said sag being measured by measuring the slope of said at least one span;
   c. generating data signals at the monitored spans corresponding to the monitored sag;
   d. determining the current carrying capacity of said electric power line span using at least the data signals generated in step (c).

* * * * *